United States Patent
Dunford et al.

(10) Patent No.: US 12,061,169 B2
(45) Date of Patent: Aug. 13, 2024

(54) SYSTEM AND METHOD FOR HOLE INSPECTION

(71) Applicant: JENTEK Sensors, Inc., Marlborough, MA (US)

(72) Inventors: Todd Dunford, Amherst, MA (US); Neil Goldfine, Cocoa Beach, FL (US); Stuart Chaplan, Marlborough, MA (US)

(73) Assignee: JENTEK Sensors, Inc., Marlborough, MA (US)

( * ) Notice: Subject to any disclaimer, the term of this patent is extended or adjusted under 35 U.S.C. 154(b) by 211 days.

(21) Appl. No.: 17/660,976

(22) Filed: Apr. 27, 2022

(65) Prior Publication Data

US 2022/0341876 A1    Oct. 27, 2022

Related U.S. Application Data

(60) Provisional application No. 63/185,413, filed on May 7, 2021, provisional application No. 63/180,305, filed on Apr. 27, 2021.

(51) Int. Cl.
 *G01N 27/90* (2021.01)
 *G01N 27/904* (2021.01)
 *G01R 33/09* (2006.01)

(52) U.S. Cl.
 CPC ....... *G01N 27/904* (2013.01); *G01N 27/9006* (2013.01); *G01R 33/091* (2013.01)

(58) Field of Classification Search
 CPC . G01N 27/9006; G01N 27/904; G01R 33/091
 See application file for complete search history.

(56) References Cited

U.S. PATENT DOCUMENTS

| | | | |
|---|---|---|---|
| 4,805,448 A * | 2/1989 | Armell | G01L 7/043 374/E5.021 |
| 6,784,662 B2 | 8/2004 | Schlicker et al. | |
| 7,467,057 B2 | 12/2008 | Sheiretov et al. | |
| 8,050,883 B2 | 11/2011 | Sheiretov et al. | |
| 10,677,756 B2 | 6/2020 | Goldfine et al. | |
| 2013/0200267 A1* | 8/2013 | Saurel | G01T 7/00 250/370.02 |
| 2021/0055262 A1 | 2/2021 | Goldfine et al. | |
| 2022/0235714 A1* | 7/2022 | Parsons | F15B 13/0402 |

\* cited by examiner

*Primary Examiner* — Alesa Allgood
(74) *Attorney, Agent, or Firm* — Zachary M. Thomas

(57) ABSTRACT

A system and method are provided for inspecting challenging material locations such as holes. The system may include a sensor cartridge ("mandrel") for hole inspection that has a helical portion to which a sensor array is attached. The radius of the helical portion can be increased or decreased by applying a torque to the helical portion thereby allowing the sensor to be inserted into a hole or pressed against the wall of the hole. A scanner is described to which mandrels can be quickly connected and changed enabling an inspector to quickly switch between different mandrels (e.g., for different holes sizes and sensor configurations). Also disclosed is an inspection procedure and data processing algorithm for performing an inspection. The data processing algorithm utilizes a signature library for enhancing the detection or sizing of features of interest such as cracks. The algorithm and library can account for material edges, various material types.

20 Claims, 10 Drawing Sheets

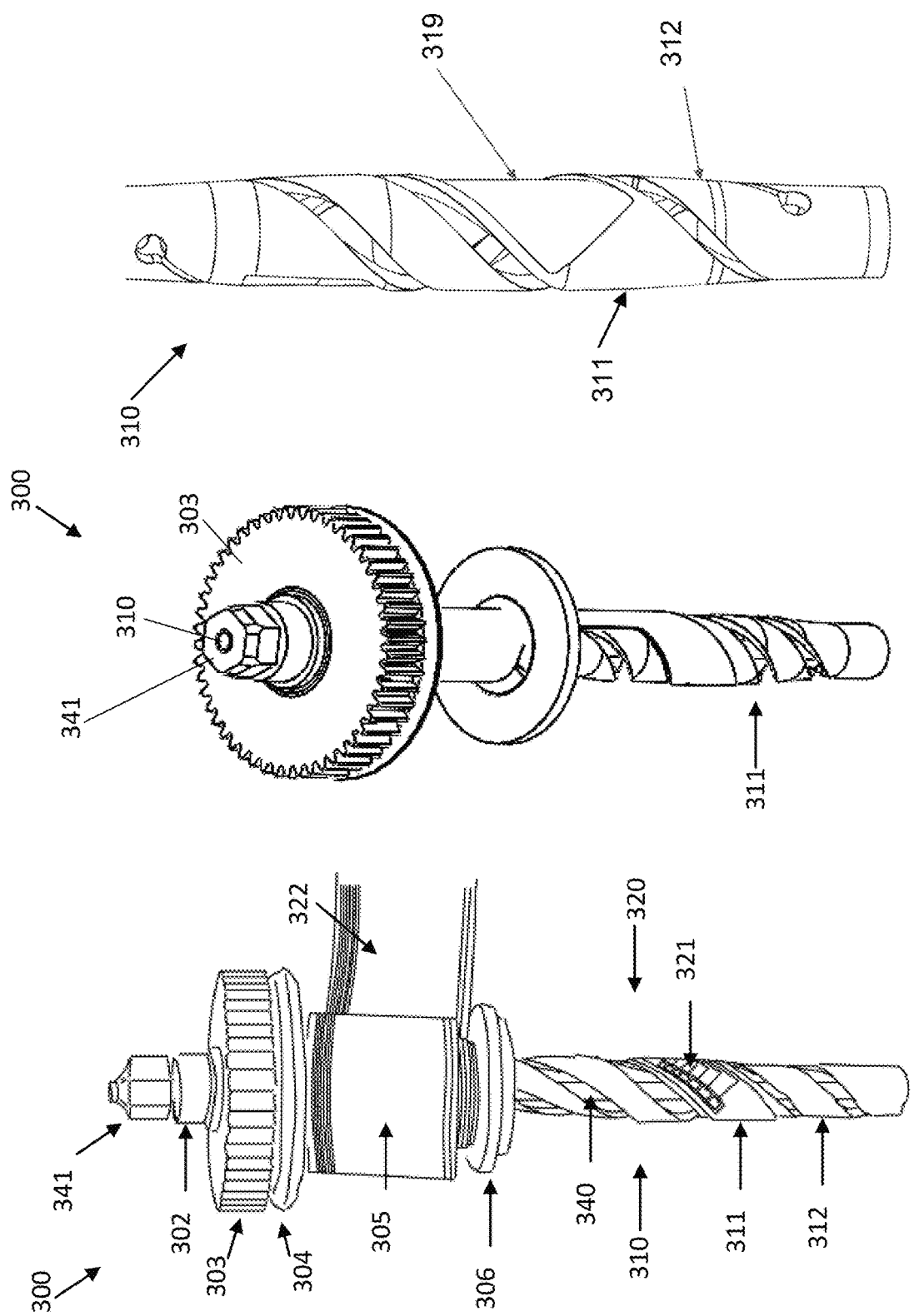

| Scenario | 1 | 2 | 3 | 4 | 5 |
|---|---|---|---|---|---|
| Stackup | Al | Al / Al | Al / Al | Al / Ti | Al / Ti |
| Output Ch 1 | off metal | on Al | on Al | on Al | on Al |
| Ch 2 | on Al/air interface | on Al | on Al | on Al | on Al |
| Ch 3 | near Al/air interface | near Al/Al interface | near Al/air interface | near Al/Ti interface | near Al/air/Ti interface |
| Ch 4 | on Al | on Al/Al interface | on Al/air/Al interface | on Al/Ti interface | on Al/air/Ti interface |
| Ch 5 | on Al | near Al/Al interface | on Al/air interface | near Al/Ti interface | on Ti/air interface |
| Ch 6 | on Al | on Al | near Al/air interface | on Ti | near Ti/air interface |
| Ch 7 | near Al/air interface | on Al | on Al | on Ti | on Ti |

FIG. 5B

| Scenario | 6 | 7 | 8 |
|---|---|---|---|
| Stackup | (Ti block on upper portion) | (Ti blocks on upper and lower portions) | (Ti blocks on upper and lower portions, split) |
| Output Ch 1 | off metal | on Ti | on Ti |
| Output Ch 2 | on Ti/air interface | on Ti | on Ti |
| Output Ch 3 | on Ti/air interface | on Ti | near Ti/air/Ti interface |
| Output Ch 4 | near Ti/air interface | on Ti/Ti interface | on Ti/air/Ti interface |
| Output Ch 5 | on Ti | on Ti | on Ti/air interface |
| Output Ch 6 | on Ti | on Ti | near Ti/air interface |
| Output Ch 7 | on Ti | on Ti | on Ti |

FIG. 5C

SYSTEM AND METHOD FOR HOLE INSPECTION

RELATED APPLICATION

The present application claims priority under 35 U.S.C. § 119(e) to U.S. provisional patent application, U.S. Ser. No. 63/180,305, filed Apr. 27, 2021 and U.S. provisional patent application, U.S. Ser. No. 63/185,413, filed May 7, 2021 which is herein incorporated by reference in its entirety.

TECHNICAL FIELD

The present disclosure relates to the field of non-destructive evaluation (NDE).

BACKGROUND

NDE can be used to evaluate the condition of materials at and during production, prior to deployment, periodically during deployment, and after deployment. In some applications, NDE of holes, such as bolt holes, is critical to determining whether a part can continue to be safely used, or if it should be repaired or replaced (or simply used less aggressively).

In U.S. Pat. No. 10,677,756, issued on Jun. 9, 2020, which is incorporated herein by reference in its entirety, Goldfine et al. (hereinafter "Goldfine I") described "an integrated mandrel" for inspecting bolt holes. The mandrel included a sensor such as an eddy current array, and mechanical support to facilitate hole inspection. A handheld scanner was contemplated for use with the mandrel and a sensor was described. Goldfine I's mandrel may include a mechanical wedge or a balloon portion that can be inflated (using gas or liquid) to apply pressure against the sensor to the bolt hole. A piston was described for actuation. Goldfine I described various scanner mechanisms to facilitate rotation of the mandrel within the bolt hole such as a slip ring scanner and the use of a spooling connection tape. A portion of the sensor measurement electronics is located on the mandrel (rotating) side while the remaining portion of the sensor measurement electronics are located on the stationary side.

In US. Patent Pub. No. 2021/0055262, published Feb. 25, 2021, which is incorporated herein by reference in its entirety, Goldfine et al. (hereinafter "Goldfine II") describes a process for enhancing detection of defects having characteristic shapes provided in a signature library. Signatures, which may be obtained from actual sensor measurements from a known defect and then correlated with sensor measurements. A large correlation may be an indication that a defect is present at the material location where the measurement data was collected. Goldfine II further describes methods for obtaining signatures for the signature library, selecting an appropriate signature from the library for data, performing single and multichannel correlation, and flagging defect detections.

SUMMARY

A system and method are provided for inspecting challenging material locations such as holes. The system may include a sensor cartridge ("mandrel") for hole inspection that has a helical portion to which a sensor array is attached. The radius of the helical portion can be increased or decreased by applying a torque to the helical portion thereby allowing the sensor to be inserted into a hole or pressed against the wall of the hole. A scanner is described to which mandrels can be quickly connected and changed enabling an inspector to quickly switch between different mandrels (e.g., for different holes sizes and sensor configurations). Also disclosed is an inspection procedure and data processing algorithm for performing an inspection. The data processing algorithm utilizes a signature library for enhancing the detection or sizing of features of interest such as cracks. The algorithm and library can account for material edges, various material types.

One aspect relates to a sensor cartridge having a control wheel; a shaft having an axis that is co-axial with the control wheel; an expansion element co-axial with the shaft, having a helical portion, a first location and a distal end, wherein the expansion element is operably fixed to the control wheel at a first location and operably fixed to a distal end of the shaft at the distal end of the expansion element; and a sensor having a sensing array portion, the sensing array portion attached to the helical portion of the expansion element.

In some embodiments the control wheel is toothed around its circumference.

In some embodiments the sensor further comprises a lead portion and the sensor cartridge further comprises a reel co-axial to the shaft for winding the lead portion of the sensor. The reel may be positioned along the axis between the control wheel and the helical portion of the expansion element. The sensor cartridge may also include a bearing having an inner ring, wherein the inner ring is around the reel. The sensor cartridge may also include a circular disc co-axial with the shaft and having a hole therein through which the shaft passes, the circular disc operably fixed to the control wheel on one side, and operably fixed to the reel on an opposite side. In some embodiments the expansion element, reel, and circular disc are a single piece of material. For example, the expansion element, reel and circular disc may be fabricated by an additive manufacturing process.

In some embodiments of the sensor cartridge the helical portion comprises a first helix and a second helix, and the sensing array portion is attached to the first helix of the helical portion. A first width of the first helix may be greater than a second width of the second helix, the first and second widths being measured in an axial direction defined by the shaft. The first helix may have an inset into which a sensor array portion of the sensor is attached.

In some embodiments, the sensor cartridge further comprises a nut operably fixed to a proximal end of the shaft.

Another aspect relates to a method of placing a sensor within a hole of a test piece. The method comprises acts of (i) providing a sensor cartridge having a shaft, and a expansion element with a helical portion, the expansion element co-axial with the shaft, the expansion element operably fixed to a distal end of the shaft at a distal end of the expansion element, the helical portion have a sensor affixed thereto, and the helical portion having in a relaxed state a first radius; (ii) tightening the helix portion by applying a torque to a proximal end of the shaft relative to a proximal end of the expansion element in a tightening direction thereby causing the helix portion to have a second radius less than the first radius; (iii) while applying the torque, inserting the sensor cartridge into the hole such that the sensor is at least partially within the hole; and (iv) releasing the torque.

In some embodiments, the hole has a hole radius, the second radius is less than the hole radius, and the first radius is equal to or greater than the hole radius.

In some embodiments, the method further comprises, (v) after releasing the torque, measuring a response of the sensor.

In some embodiments, the helical portion of the provided sensor cartridge comprises at least one left handed helix and the tightening of the helical portion is achieved by applying a clockwise torque to the helix portion.

In some embodiments, the helical portion of the provided sensor cartridge comprises at least one right handed helix and the tightening of the helical portion is achieved by applying a counter-clockwise torque to the helix portion.

Yet another aspect relates to a method of placing a sensor within a hole of a test piece, the method comprising acts of (i) providing a sensor cartridge having a shaft, and a expansion element with a helical portion, the expansion element co-axial with the shaft, the expansion element operably fixed to a distal end of the shaft at a distal end of the expansion element, the helical portion have a sensor affixed thereto, and the helical portion having in a relaxed state a first radius; (ii) inserting the sensor cartridge into the hole such that the sensor is at least partially within the hole; and (iii) expanding the helix portion by applying a torque to a proximal end of the shaft relative to a proximal end of the expansion element in an expanding direction thereby causing the helix portion to have a second radius greater than the first radius.

In some embodiments the hole has a hole radius and the first radius is less than the hole radius.

In some embodiments the method further comprises an act of (iv) measuring a response of the sensor while applying the torque to expand the helix portion.

Yet another aspect relates to a method for enhancing a primary feature in a test object, the method comprising acts of (i) storing a signature for a secondary feature in a non-transient computer-readable storage medium; (ii) placing a sensor having a drive conductor and at least one sense element proximate to the test object; (iii) scanning the sensor across the test object; (iv) during the scanning operating an immittance instrument to excite the drive conductor and obtain sensor data by measuring the at least one sense element; and (v) operating a processor to (1) locate the secondary feature by calculating a correlation based on the signature and the sensor data; and (2) suppress the secondary feature in the sensor data based on the correlation thereby enhancing the primary feature.

In some embodiments, the test object has adjacent first and second material layers, the secondary feature is a fastener response due the presence of a fastener through the first and second material layers. In some embodiments, operating the processor to suppress the secondary feature comprises subtracting the signature, after scaling, from the sensor data.

In some embodiments, act (v) further comprises operating the processor to (3) prior to acts (v)(1) and (v)(2), estimate a material property of the test object, wherein the operating the processor to suppress the secondary feature comprises modifying the estimate of the material property based on the correlation. In some embodiments, act (v) further comprises operating the processor to (4) determine if the primary feature is present based on the modified material property estimate. In some embodiments, the primary feature is one of a group consisting of a crack, a pit, and a scratch. In some embodiments, the test object has adjacent first and second material layers and the modified material property estimates a gap distance between the first and second material layers.

In some embodiments, the secondary feature is one of a group consisting of a fastener, a groove in the test object, an edge of the test object, and a thickness of an insulating coating portion of the test object.

In some embodiments, the test object has adjacent first and second material layers, and act (v) further comprises operating the processor to (3) prior to acts (v)(1) and (v)(2), estimate material properties of the test object including a thickness of the first material layer and electrical conductivities of the first and second layers by utilizing a multivariate inverse method and a precomputed database, wherein in act (v)(1) the correlation based on the signature and at least one of the estimated material properties.

In some embodiments, the method further comprises storing a plurality of signatures for the secondary feature, the plurality of signatures including the signature, and act (v) further comprises operating the processor to (3) prior to acts (v)(1) and (v)(2), compare the sense element responses to a library of characteristic responses for a non-relevant feature to select a reference characteristic response and using this reference characteristic response to adjust the sense element response. In some embodiments, a characteristic response includes a sense element response variation with scan position. In some embodiments, a characteristic response includes information from at least two sense elements. In some embodiments, adjusting the sense element response comprises subtracting the reference characteristic response from the sense element response for each excitation frequency.

Yet another aspect relates to a method for detecting a feature on a first edge of a test material layer, the test material layer also having a second edge, the method comprising acts of first scanning an eddy current sensor in a direction substantially parallel to the first edge, the eddy current sensor having a linear drive conductor and at least two sensing elements at a same distance from the linear drive conductor; measuring, during the first scanning, simultaneous responses of the at least two sensing elements; moving the sensor perpendicular to the first edge in an increment less than or equal to a scan width; second scanning and measuring the sensor in the incremented position; repeating, as necessary, the moving and the second scanning at least until the second edge is inspected; estimating a location of the first edge and the second edge from the responses of at the least one sensing element; operating a processor to compute a metric value that represents a quality of a match between at least a subset of the inspection datapoints and a reference signature for the feature, the reference signature having a plurality of reference signature datapoints; comparing the metric value to a threshold value to determine whether the feature is present within the distance requiring inspection for the test material; and providing an automated report of the location of the feature along the scan direction and relative to the first edge in the direction perpendicular to the first edge, where the location of the feature is determined from the responses of the at least two sensing elements. In some embodiments, the feature is a crack, or a pit, or a scratch.

In some embodiments, the location of the feature is used to determine which layer the feature is in which in turn verifies that the proper signature was used. In some embodiments, the proper signature is selected based on one of the following, layer conductivity, layer thickness, liftoff for the layer. In some embodiments, a gap between layers is estimated.

In some embodiments, the increment is equal to a scan width covered by the at least two sensing elements minus an overlap region that is between 50% and 250% of a width of one sensing element in a direction of the increment.

In some embodiments, the increment is estimated by comparing sequential scans in the overlap region.

In some embodiments, the method further comprises storing on a non-transient computer-readable storage medium a set of inspection datapoints for a plurality scan direction locations along the first edge;

In some embodiments, each inspection datapoint in the scan direction is associated with a spatial location within a hole in a multiple layer stack-up and the two edges are the upper and lower edges of a layer in the multiple layer stack-up.

In some embodiments, the stack-up is comprised of at least two layers and the method further comprises estimating the electrical conductivity of each layer using a multivariate inverse method that uses a precomputed database of sensor responses to estimate both the conductivity and liftoff to ensure that the conductivity value is independent of the liftoff; where the conductivity and liftoff C-Scan images are displayed for the operator to verify that the required inspection area was scanned completely and throughout the scan the liftoff did not exceeding a prescribed value above which the signal-to-noise for detection of the feature of interest is not less than 2, where this prescribed liftoff value is determined in advance from empirical tests on representative parts that include at least one representative feature.

In some embodiments, the feature is a crack and the crack location is indicated on the conductivity C-Scan image as a red marking with the extent of the red marking approximately representing the extent of the defect in both the scan direction and the direction perpendicular to the essentially straight edge.

Yet another aspect relates to a method for detecting a feature in a hole in a test material, the method comprising acts of (i) storing on a non-transient computer-readable storage medium a set of inspection datapoints for a plurality circumferential locations within the hole; (ii) operating a processor to compute a metric value that represents a quality of a match between at least a subset of the inspection datapoints and a reference signature for the feature, the reference signature having a plurality of reference signature datapoints; and (iii) comparing the metric value to a threshold value to determine whether the feature is present within the hole in the test material.

In some embodiments, the test material has a plurality of material layers and the reference signature is part of a signature library having a plurality of references signatures for the feature, and the method further comprises (iv) determining an electrical conductivity of a material layer with which a subset of inspection datapoints is associated based in part on the subset of inspection datapoints; and (v) selecting the reference signature from the signature library based at least in part on the electrical conductivity of the material layer.

In some embodiments, each inspection datapoint is associated with a spatial location within the hole. In some embodiments, the set of inspection datapoints comprises a first subset of inspection datapoints measured at a first excitation frequency and a second subset of inspection datapoints measured at a second excitation frequency. In some embodiments, the reference signature is part of a signature library having a plurality of references signatures for the feature, and the method further comprises selecting the reference signature from the signature library based at least in part on the spatial location of at least one inspection datapoint within the subset of the inspection datapoints. In some embodiments, the spatial location comprises an axial location and the selecting of the reference signature is based at least in part on the axial location of the at least one inspection datapoint. In some embodiments, the spatial location comprises an axial location and the selecting of the reference signature is based at least in part on the relative position of the axial location of the at least one inspection datapoint to a second axial location in the hole. In some embodiments, the second axial location is at the edge of a layer in a multiple layer stackup.

In some embodiments, the test material has a plurality of material layers and the reference signature is part of a signature library having a plurality of references signatures for the feature, and the method further comprises (iv) determining an electrical conductivity of a material layer with which the subset of inspection datapoints is associated; and (v) selecting the reference signature from the signature library based at least in part on the electrical conductivity of the material layer.

In some embodiments, the test material has a plurality of material layers and the reference signature is part of a signature library having a plurality of references signatures for the feature, and the method further comprises (iv) determining an layer thickness of a material layer with which the subset of inspection datapoints is associated; and (v) selecting the reference signature from the signature library based at least in part on the layer thickness of the material layer.

In some embodiments, the test material has a plurality of material layers and the reference signature is part of a signature library having a plurality of references signatures for the feature, and the method further comprises (iv) determining a liftoff with which the subset of inspection datapoints is associated; and (v) selecting the reference signature from the signature library based at least in part on the liftoff.

In some embodiments, each inspection datapoint provides a respective sensor impedance value.

In some embodiments, each inspection datapoint provides a respective at least one property value associated with the test material. In some embodiments, each respective at least one property value is for an electrical conductivity associated with the test material. In some embodiments, the feature is a notch. In some embodiments, the feature is a crack. In some embodiments, the feature is a scratch.

In some embodiments, the feature circumferential and axial location is determined.

In some embodiments, the subset of inspection datapoints comprises first and second pluralities of inspection datapoints associated with first and second sense channels of a sensor array, respectively, wherein the first and second sense channels are adjacent in the sensor array.

In some embodiments, the library of reference signature datapoints includes at least two sets of reference signature datapoints. In some embodiments, the library of reference signature datapoints includes values for at least two test material layer thicknesses. In some embodiments, the library of reference signature datapoints includes values for at least two test material layer electrical conductivities. In some embodiments, the library of reference signature datapoints includes values for at least two feature positions within the sensor active area. In some embodiments, the library of reference signature datapoints includes values for at least two feature axial positions within a test material layer. In some embodiments, the library of reference signature datapoints includes values for at least two sensor proximities to the hole material surface. In some embodiments, the library of reference signature datapoints includes values for at least two sensor axial positions within the hole.

The foregoing is a non-limiting summary of the invention, which is defined by the attached claims.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 3A is a view of a mandrel according to some embodiments;

FIG. 3B is another view of the mandrel according to some embodiments;

FIG. 3C is a detailed view of the helical portion of the mandrel according to some embodiments;

FIG. 5B is a chart showing 5 example scenarios of sense element position relative to various material layer interfaces;

FIG. 5C is a chart showing and addition 3 example scenarios of sense element position relative to various material layer interfaces;

DETAILED DESCRIPTION

Non-destructive inspection of materials is critical for many applications, but such inspections can be challenging because of object geometry, material, and access issues. The inventors have recognized and appreciated the need for improved inspection procedures and equipment with which to perform such challenging inspections.

An example of a challenging inspection application is hole inspection such as for holes used for bolts and other fasteners. For applications in which an unfilled hole can be inspected directly (e.g., without the fastener installed) there is an opportunity to provide a high resolution inspection of the hole for a variety of features such as defects.

A system and method are provided for inspecting challenging material locations such as holes. The system may include a scanner and a sensor cartridge ("mandrel") for inspecting holes with a sensor technology that may generally perform better where the sensor is in close proximity to the wall of the hole, such as an eddy current sensor. The mandrel has a helical portion to which such a sensor is attached. The radius of the helical portion can be increased or decreased by applying a torque to the helical portion thereby allowing the sensor to be inserted into a hole or pressed against the wall of the hole. Different mandrels may be provided for different hole sizes and different sensor configurations. Also disclosed is an inspection procedure and data processing algorithm for performing an inspection. The data processing algorithm utilizes a signature library for enhancing the detection or sizing of features of interest such as cracks. The algorithm and library can account for material edges, various material types.

The remainder of the Detailed Description is organized as follows. Section I provides an overview for an inspection system. Section II provides a description of a bolt hole inspection system. Section III provides a procedure for inspecting bolt holes using the inspection system. Section IV describes how data collected from the sensor for a hole may be analyzed to identify various material electrical and geometric properties (e.g., number of layers, layer thickness, edge positions, layer conductivities), and how various types of defects may be detected. Section V describes how a signature library may be generated and used for hole inspection, corrosion detection, and other applications. Finally, Section VI provides a closing discussion.

SECTION I—SYSTEM OVERVIEW

Figure 1:
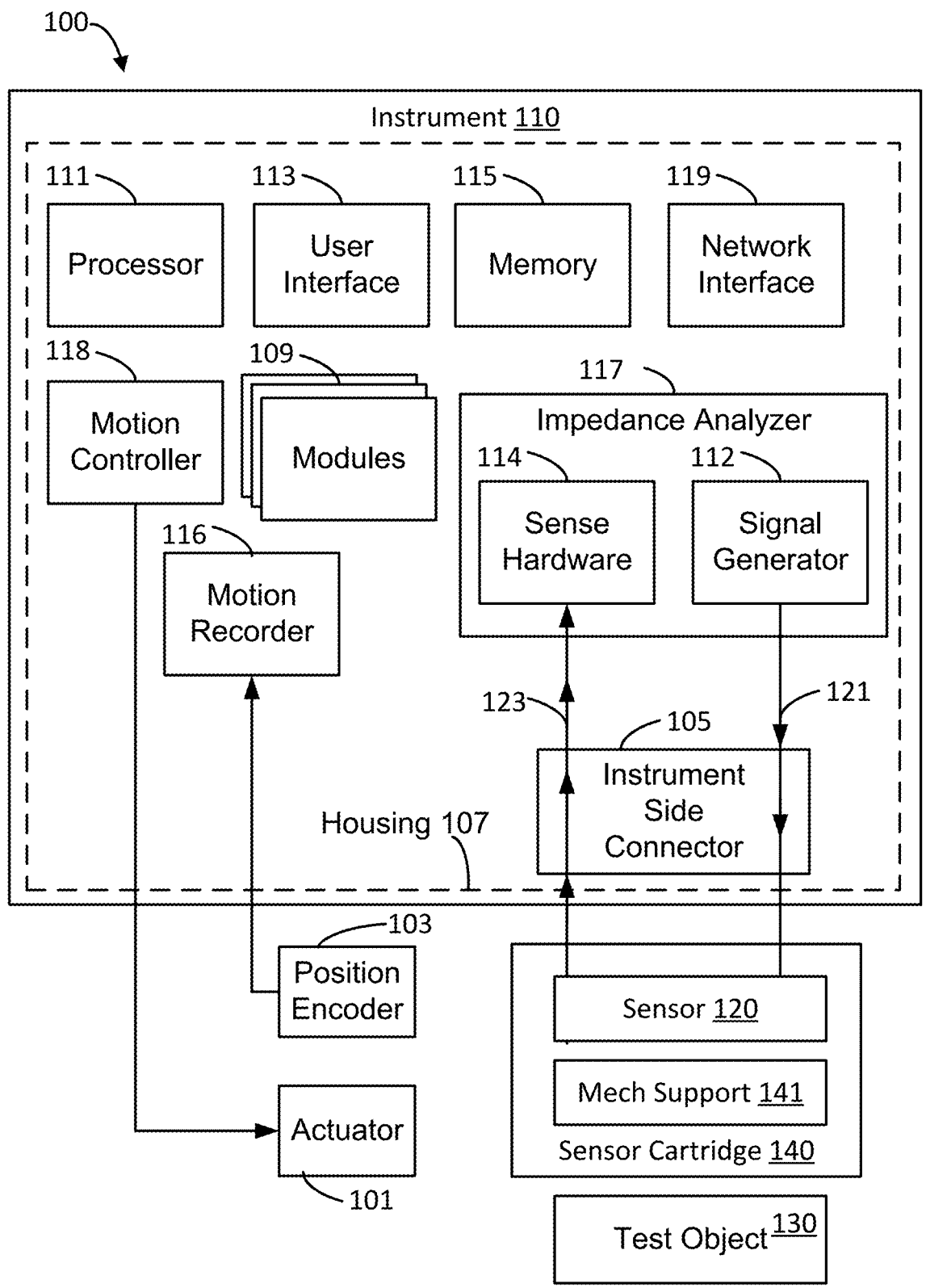
FIG. 1 is a block diagram a system for inspecting a test object according to some embodiments.

FIG. 1 is a block diagram of a system 100 for inspecting a test object 130. System 100 includes an instrument 110 and a sensor cartridge 140. Instrument 110 may be housed in a housing 107; in some embodiments the housing is substantially cylindrical in shape. Sensor cartridge 140 may have a rigid connector which interfaces both mechanically and electrically with an instrument side connector 105. Advantageously in some embodiments both the electrical and mechanical connections of sensor cartridge 140 engage simultaneously with instrument side connector 105. In some other embodiments, sensor cartridge is functionally connected to instrument side connector 105 through a cable. Sensor cartridge 140 in some embodiments also includes a flexible sensor 120, and a mechanical support 141 to which the sensor is attached. Sensor 120 may be attached to mechanical support 141 with glue, tape, double sided tape, or in any suitable way. Instrument 110 is configured to provide excitation signals 121 to sensor 120 and measure the resulting response signals 123 of sensor 120. Response signals 123 may be measured and processed to estimate properties of interest, such as electromagnetic properties (e.g., electrical conductivity, permeability, and permittivity), geometric properties (e.g., layer thickness, sensor liftoff), material condition (e.g., fault/no fault, crack size, layer to layer bond integrity, porosity, residual stress level, temperature), or any other suitable property or combination thereof including properties of the fabricated part and the powder. (Sensor liftoff is a distance between the sensor and the closest surface of the test object for which the sensor is sensitive to the test object's electrical properties.)

Instrument 110 may include a processor 111, a user interface 113, memory 115, an impedance analyzer 117, and a network interface 119. Though, in some embodiments of instrument 110 may include other combinations of components. While instrument 110 is drawn with housing 107, it should be appreciated that instrument 110 may be physically realized as a single mechanical enclosure; multiple, operably-connected mechanical enclosures, or in any other suitable way. For example, in some embodiments it may be desired to provide certain components of instrument 110 as proximal to sensor 120 as practical, while other components of instrument 110 may be located at greater distance from sensor 120.

Processor 111 may be configured to control instrument 110 and may be operatively connected to memory 115. Processor 111 may be any suitable processing device such as for example and not limitation, a central processing unit (CPU), digital signal processor (DSP), controller, addressable controller, general or special purpose microprocessor, microcontroller, addressable microprocessor, programmable processor, programmable controller, dedicated processor, dedicated controller, or any suitable processing device. In some embodiments, processor 111 comprises one or more processors, for example, processor 111 may have multiple cores and/or be comprised of multiple microchips. Processing of sensor data and other computations such as for control may be performed sequentially, in parallel, or by some other method or combination of methods.

Memory 115 may be integrated into processor 111 and/or may include "off-chip" memory that may be accessible to processor 111, for example, via a memory bus (not shown). Memory 115 may store software modules that when executed by processor 111 perform desired functions. Memory 115 may be any suitable type of non-transient computer-readable storage medium such as, for example and not limitation, RAM, a nanotechnology-based memory, optical disks, volatile and non-volatile memory devices, magnetic tapes, flash memories, hard disk drive, circuit configurations in Field Programmable Gate Arrays (FPGA), or other semiconductor devices, or other tangible, non-transient computer storage medium.

Instrument 110 may have one or more functional modules 109. Modules 109 may operate to perform specific functions such as processing and analyzing data. Modules 109 may be implemented in hardware, software, or any suitable combination thereof. Memory 115 of instrument 110 may store computer-executable software modules that contain computer-executable instructions. For example, one or more of modules 109 may be stored as computer-executable code in memory 115. These modules may be read for execution by processor 111. Though, this is just an illustrative embodiment and other storage locations and execution means are possible.

Instrument 110 provides excitation signals for sensor 120 and measures the response signal from sensor 120 using impedance analyzer 117. Impedance analyzer 117 may contain a signal generator 112 for providing the excitation signal to sensor 120. Signal generator 112 may provide a suitable voltage and/or current waveform for driving sensor 120. For example, signal generator 112 may provide a sinusoidal signal at one or more selected frequencies, a pulse, a ramp, or any other suitable waveform. Signal generator may provide digital or analog signals and include conversion from one mode to another.

Sense hardware 114 may comprise multiple sensing channels for processing multiple sensing element responses in parallel. As there is generally a one to one correspondence between sense elements and instrumentation channels these terms may be used interchangeably. It should be appreciated that care should be used, for example, when multiplexing is used to allow a single channel to measure multiple sense elements. For sensors with a single drive and multiple sensing elements such as the MWM®-Array eddy current array available from JENTEK® Sensors, Inc., the sensing element response may be measured simultaneously at one or multiple frequencies including simultaneous measurement of real and imaginary parts of the transimpedance. Though, other configurations may be used. For example, sense hardware 114 may comprise multiplexing hardware to facilitate serial processing of the response of multiple sensing elements and for eddy current arrays other than MWM-Arrays multiplexing may be used for combinations of sensing elements and drive elements. Some embodiments use MWM-Array formats to take advantage of the linear drive and the ability to maintain a consistent eddy current pattern across the part using such a linear drive. Sense hardware 114 may measure sensor transimpedance for one or more excitation signals at on one or more sense elements of sensor 120. It should be appreciated that while transimpedance (sometimes referred to simply as impedance), may be referred to as the sensor response, the way the sensor response is represented is not critical and any suitable representation may be used. In some embodiments, the output of sense hardware 114 is stored along with temporal information (e.g., a time stamp) to allow for later temporal correlation of the data, and positional data correlation to associate the sensor response with a particular location on test object 130. Instrumentation may also operate in a pulsed mode with time gates used to provide multiple sensing outputs and multiple channels used to acquire data from multiple sensing elements. If these sensing elements have different drive-sense gaps (distance between a drive conductor (or electrode) and the sensing winding (or electrode), then this is referred to as a segmented field sensor. Thus, sensor operation can be at a single frequency, multiple frequencies, or in a pulsed mode where the drive is turned on and off in a prescribed manner or switched between two or more modes of excitation.

Sensor 120 is an eddy-current sensor; though in some other embodiments it may be a dielectrometry sensor, thermography method, or utilize any other suitable sensing technology or combination of sensing technologies. In some embodiments sensor 120 provides temperature measurement, voltage amplitude measurement, strain sensing or other suitable sensing modalities or combination of sensing modalities. In some embodiments, sensor 120 is an eddy-current sensor such as an MWM, MWM-Rosette, or MWM-Array sensor available from JENTEK Sensors, Inc., Marlborough, MA A discussion of some MWM-Array sensors is found in U.S. Pat. No. 6,784,662, issued on Aug. 31, 2004 which is hereby incorporated by reference in its entirety. Sensor 120 may be a magnetic field sensor or sensor array such as a magnetoresistive sensor (e.g., MR-MWM-Array sensor available from JENTEK Sensors, Inc.), a segmented field MWM sensor, and the like. In some embodiments sensor 120 is an interdigitated dielectrometry sensor or a segmented field dielectrometry sensor such as the IDED® sensors also available from JENTEK Sensors, Inc. Segmented field sensors have sensing elements at different distances from the drive winding or drive electrode to enable interrogation of a material to different depths at the same drive input frequency. Sensor 120 may have a single or multiple sensing and drive elements. Sensor 120 may be scanned across, mounted on, or embedded into test object 130.

In some embodiments, the computer-executable software modules may include a sensor data processing module, that when executed, estimates properties of test object 130. The sensor data processing module may utilize multi-dimensional precomputed databases that relate one or more frequency transimpedance measurements to properties of test object 130 to be estimated. The generation of suitable databases and the implementation of suitable multivariate inverse methods are described, for example, in U.S. Pat. No.

7,467,057, issued on Dec. 16, 2008, and U.S. Pat. No. 8,050,883, issued on Nov. 1, 2011, both of which are herein incorporated by reference in their entirety. The sensor data processing module may take the precomputed database and sensor data and, using a multivariate inverse method, estimate material properties for the processed part or the powder. Though, the material properties may be estimated using any other analytical model, empirical model, database, look-up table, or other suitable technique or combination of techniques.

User interface 113 may include devices for interacting with a user. These devices may include, by way of example and not limitation, keypad, pointing device, camera, display, touch screen, audio input and audio output.

Network interface 119 may be any suitable combination of hardware and software configured to communicate over a network. For example, network interface 119 may be implemented as a network interface driver and a network interface card (NIC). The network interface driver may be configured to receive instructions from other components of instrument 110 to perform operations with the NIC. The NIC provides a wired and/or wireless connection to the network. The NIC is configured to generate and receive signals for communication over network. In some embodiments, instrument 110 is distributed among a plurality of networked computing devices. Each computing device may have a network interface for communicating with other computing devices forming instrument 110.

In some embodiments, multiple instruments 110 are used together as part of system 100. Such systems may communicate via their respective network interfaces. In some embodiments, some components are shared among the instruments. For example, a single computer may be used to control all instruments. In one embodiment multiple areas on the test object are scanned using multiple sensors simultaneously or in an otherwise coordinated fashion to use multiple instruments and multiple sensor arrays with multiple integrated connectors to inspect the test object surface faster or more conveniently.

Actuator 101 may be used to position sensor cartridge 140 with respect to test object 130 and ensure that the liftoff of the sensor 120 is in a desired range relative to the test object 130. Actuator 101 may be an electric motor, pneumatic cylinder, hydraulic cylinder, or any other suitable type or combination of types of actuators for facilitating movement of sensor cartridge 140 with respect to test object 130. Actuators 101 may be controlled by motion controller 118. Motion controller 118 may control sensor cartridge 140 to move sensor 120 relative to test object 130.

Regardless of whether motion is controlled by motion controller 118 or directly by the operator, position encoder 103 and motion recorder 116 may be used to record the relative positions of sensor 120 and test object 130. This position information may be recorded with impedance measurements obtained by impedance instrument 117 so that the impedance data may be spatially registered.

For some applications the performance of system 100 depends (among other things) on the proximity of sensor 120 to test object 130; that is to say the sensor liftoff may be critical to performance for such applications. For example, crack detection in an aerospace application may require cracks 0.5 mm (0.02 inches) in length be reliably detectable in test object 130 (e.g., a turbine disk slot). In order to achieve reliable detection of a small crack, sensor 120's liftoff may need to be kept to under 0.25 mm (0.010 inches). Further, for such an application, sensor 120 may preferably be a sensor array, thus the liftoff of each element in the array may need to be kept to under 0.25 mm (0.010 inches). (It should be appreciated that these dimensions are illustrative and the specific requirements will be dictated by the details of the application.) Measurements may be complicated when test object 130 has a complex curved surface that may change along a measurement scan path.

SECTION II—BOLT HOLE INSPECTION SYSTEM

Figure 2:
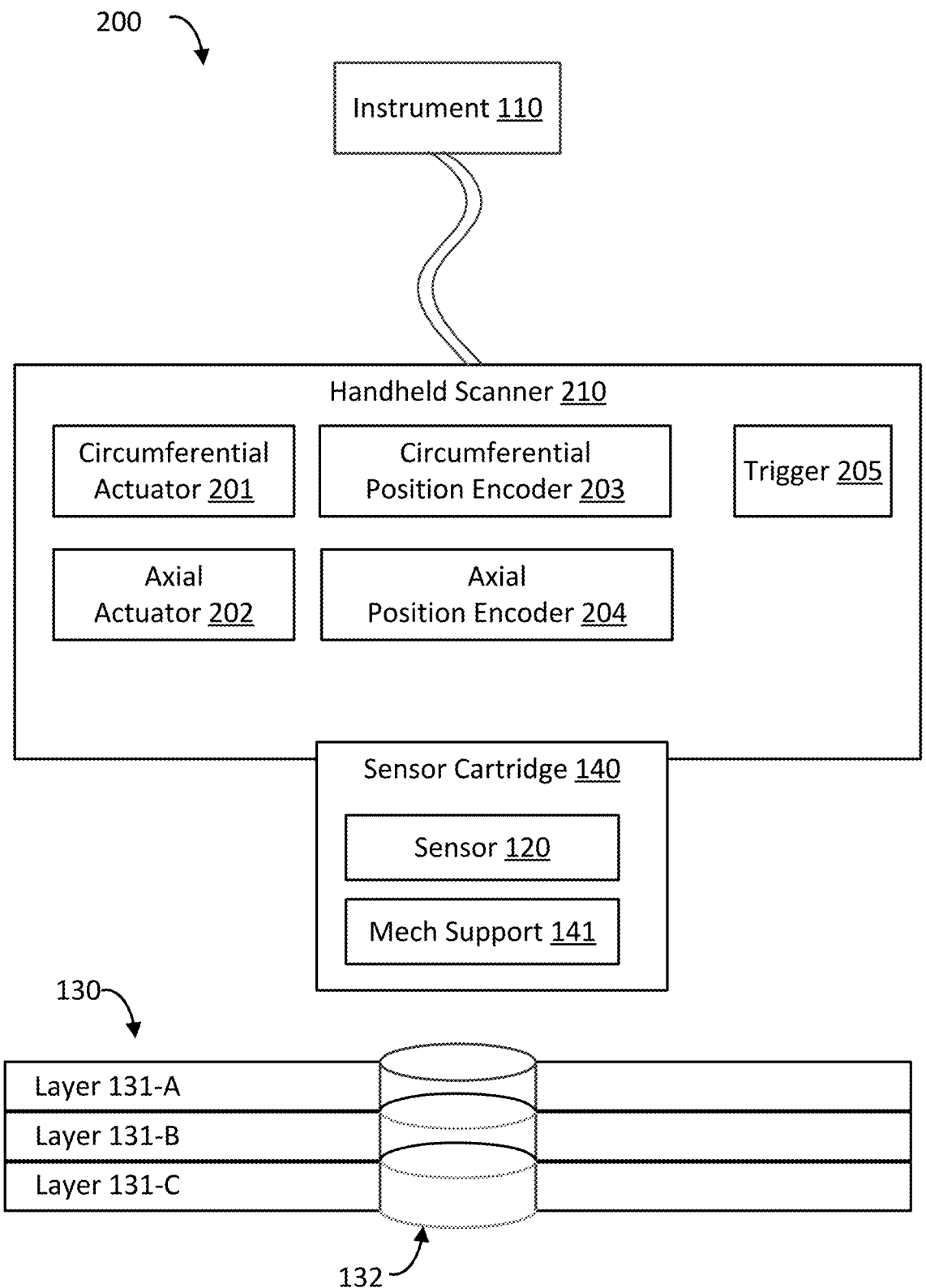
FIG. 2 is a block diagram of a system for inspecting a hole in a test object according to some embodiments.

Bolt holes in aerospace and other fields may require inspection to determine if the hole has fatigue cracks or other forms of damage. FIG. 2 shows a system 200 for hole inspection according to some embodiments. System 200 may generally be considered an embodiment of system 100, and thus the discussion of system 100 is generally applicable to system 200. System 200 may include an instrument 110 such as that described with reference to FIG. 1, a handheld scanner 210, and a sensor cartridge 140.

FIG. 2 shows an example test object 130 having layers 131-A, 131-B, and 131-C, generally referred to as layers 131. Test object 130 may have any number of layers 131 and the illustration of three layers is for example only. Test object 130 has a hole 132 to be inspected. In some discussions the term "stackup" is used to refer to the sequence of layers in a test object 130.

Scanner 210 is a device for changing the position of sensor cartridge 140 relative to hole 132 and facilitating inspection measurements of the hole by instrument 110. Scanner 210 may be connected to instrument 110 by a cable such that instrument 110 can be a few feet away from scanner 210 or integrated into a single unit with instrument 110. Though, instrument 110 may interface with scanner 210 and sensor cartridge 140 in any suitable way.

Scanner 210 may control both the axial and circumferential position of sensor 120 within hole 132, though in some embodiments sensor 120 may be an array of sufficient size such that scanning in only one direction is necessary. For example, sensor 120 may be a sensing array that provides coverage around the entire circumference of hole 132 such that scanning may only need to be performed in the axial direction. As another example, sensor 120 may be a sensor array that provides coverage along the entire depth of the hole such that scanner 210 may only need to scan in the circumferential direction. In some other embodiments, sensor 120 only provides partial coverage in both the axial and circumferential directions and scanner 210 may control motion in both directions to facilitate inspection of the hole.

Scanner 210 may include circumferential actuator 201, circumferential position encoder 203, axial actuator 202, axial position encoder 204 and trigger 205. Scanner 210 also includes hardware for mechanically supporting sensor cartridge 140.

Circumferential actuator 201 may be used to control the circumferential position of sensor 120 relative to hole 132. Similarly, axial actuator 202 may be used to control the axial position of sensor 120 relative to hole 132. Any suitable actuator may be used such as an electric motor. In some embodiments the axial and/or the circumferential position may be controlled by hand or using a mechanical device without use of automation.

Circumferential position encoder 203 and axial position encoder 204 record the position of sensor 120 in the circumferential and axial directions, respectively. In some embodiments, the circumferential and/or axial position encoders may not be required.

Trigger 205 provides a mechanism for user input to control the scanning and inspection process. Trigger 205 may be, for example, a button. Though trigger 205 may generally be any suitable form of user input such as those described in connection with user interface 113 (FIG. 1).

An example of sensor cartridge 140 is shown in FIG. 3A as sensor cartridge 300. Sensor cartridge 300 may be used, for example, with system 200, though sensor cartridge 300 may be used in any suitable way. Sensor Cartridge 300 includes a mechanical support and a sensor 320. Sensor cartridge 300 may be used for inspecting bolt holes or other hole locations as discussed further herein. Sensor cartridge 300 has an expansion element 310 which includes a helical portion to which a sensor array portion 321 of sensor 320 is mounted. A shaft 340 runs the length of cartridge 300 and down the center of helical portion 310. The distal end of shaft 340 is operably fixed to the distal end of the expansion element 310. The proximal end of shaft 340 has a nut 341 operably fixed thereto. Sensor Cartridge 300 may be used, in part, by rotating shaft 340 relative to expansion portion 310. This relative motion will cause the diameter of the helical portion of expansion element 310 to expand or contract, depending on the direction of the relative motion. For example, sensor cartridge 300 may be inserted into a hole in a contracted state and used to scan the hole in an expanded state whereby sensor array portion 321 is in intimate contact with the wall of the hole achieving a low liftoff.

The term "operably fixed" as used herein is used to describe a mechanical relationship between two components wherein the two components are connected in such a way that a relative movement between the two components requires one or both of the components to flex (or the component therebetween, if any, to flex). The two components may be fixed to one another mechanically (e.g., splines, adhesives), the two components may share a piece of material (i.e., the two components are effectively portions of a single component), or the two components may be fixed to one another through one or more additional components.

A description of some further embodiments of sensor cartridge 300 are now provided with reference to FIGS. 3A-F.

Sensor cartridge 300 according to some embodiments is shown in FIG. 3A. Sensor cartridge 300 may include a sensor 320. Sensor 320 has a sensor array portion 321 which has the elements for obtaining sensor data. Sensor array 320 may be an eddy current array sensor such as sensor 400 shown in FIG. 4A. Sensor 320 may have a lead portion 322 that provides and connection between the sensor array portion 321 and the measurement instrumentation (e.g., instrument 110). FIG. 3B shows another view of sensor cartridge 300 without sensor 320 to further illustrate some additional aspects.

Sensor cartridge 300 may have a control wheel 303 that provides circumferential motion of the sensor cartridge 300 relative to the handheld scanner 210 and/or the test object 130. In some embodiments control wheel 303 may not be included as part of sensor cartridge 300; for example, if sensor 320 provides full circumferential coverage of hole 132 it may not be necessary to scan circumferentially. Though, in some such embodiments control wheel 303 may be included as a mechanism with which to apply torque to the helical portion and thus expand or contract the radius of the helical portion. Examples of control wheel 303 include a gear, a pulley, and a timing pulley. In these cases, the control wheel 303 would interface with the circumferential actuator 201. Alternatively, control wheel 303 can be a functional component of circumferential actuator 201. For example, circumferential actuator 201 could be the stator of an electric motor and control wheel 303 could be the rotor of an electric motor and the electric motor is only complete when the two components are combined.

Sensor cartridge 300 has expansion element 310. Expansion element 310 may have a helical portion having one or more helixes coaxial with shaft 340. In the embodiment shown in FIG. 3A, the helical portion has a first helix 311 and a second helix 312. The helix can twist in either direction (clockwise or counterclockwise). Helix 311 is shown wider (in the axial direction) than helix 312. Helix 311 is wide enough where the sensor array portion 321 of sensor 320 mounts to it. Helix 311 may also include a recess 319 in the surface such that sensor 320 may be mounted inside of the recess as shown in FIG. 3C. (Note shaft 340 is not shown for clarity.) The angle of helix 311 and 312 should be the same, but various helix angles (or turns per unit distance) may be used. In some embodiments it is desirable to orient a sensor at a 45 degree angle relative (though any suitable orientation may be used). The helix angle and/or the orientation of recess 319 may be selected to facilitate securing sensor 320 at the desired sensor orientation.

Figure 3F:
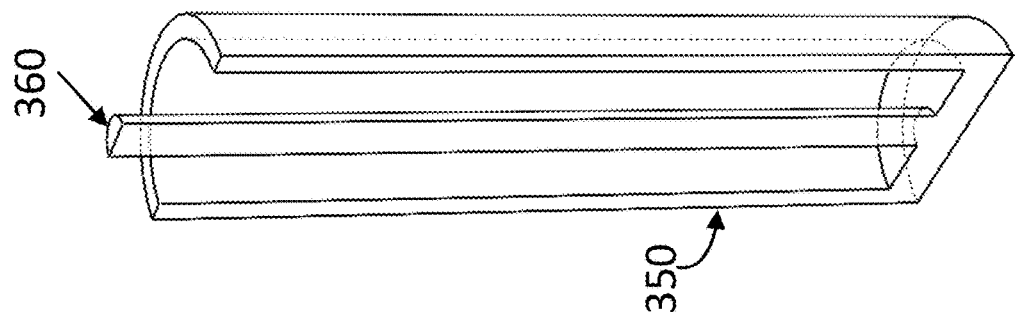
FIG. 3F is a cut-away perspective view of the simplified mandrel to illustrate application of torque to the mandrel according to some embodiments.
Figure 3E:
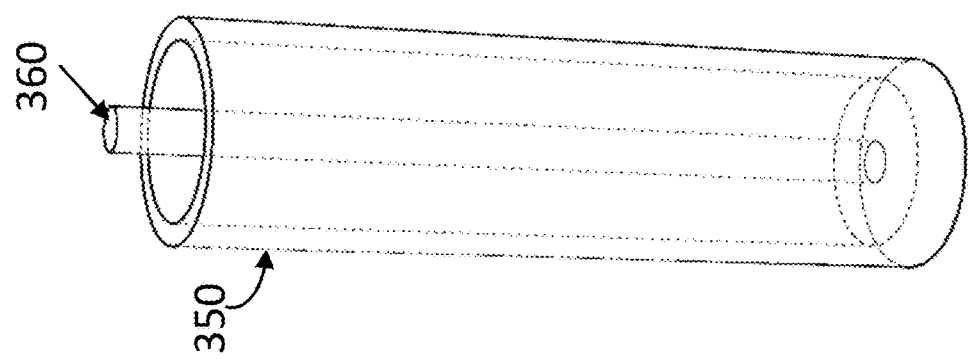
FIG. 3E is another perspective view of the simplified mandrel to illustrate application of torque to the mandrel according to some embodiments.
Figure 3D:
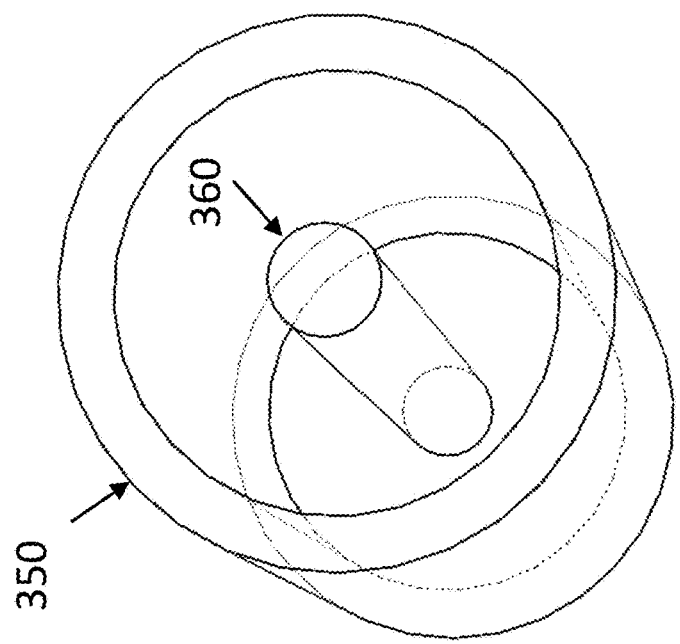
FIG. 3D is a perspective view of a simplified mandrel to illustrate application of torque to the mandrel according to some embodiments.

A simplified schematic showing the application of torque to the outer component is shown in FIGS. 3D-3F where the outer expansion element is labeled 350, and the rotating shaft is labeled 360.

Expansion element 310 may be made of a semi-rigid material such that relative circumferential motion between the proximal and distal ends of the expansion element 310 allow expansion element 310 to increase and/or decrease in diameter without causing deformation of the material. The change in diameter must be sufficient to allow for a contracted state where the diameter of the expansion element 310 is less than diameter of hole 132 and an expanded state where the diameter of the expansion element 310 is equal to or greater than the diameter of hole 132. When the expansion element is in hole 132 and placed in the expanded state, the diameter of the expansion element must be able to be restricted to the diameter of hole 132 without causing deformation of the material.

In one embodiment, the expansion element 310 is in the expanded state when undeformed and the contracted state is achieved by moving the distal end relative to the proximal end. In a second embodiment, the expansion element 310 is in the contracted state when undeformed and the expanded state is achieved by moving the distal end relative to the proximal end. The relative motion may be rotation or displacement or both.

Sensor cartridge 300 has a shaft 340 that may extend the length of the cartridge. Shaft 340 may be made of metal, or any suitable material and may have a cylindrical or other cross section. The distal end of shaft 320 may be operably connected to the distal end of expansion element 310. In some embodiments, shaft 340 has a key at its distal end which engages with the distal end of expansion element 310. The key may be operably fixed to the distal end of the expansion element, or it may have a loose fit such that some rotation of the shaft relative to the expansion element is permitted before the key is engaged and torque is transferred between the shaft and expansion elements.

Sensor cartridge 300 may have a reel 305 about which the lead portion 322 of sensor 320 may be wrapped. More specifically, during operation, as sensor cartridge 300 is rotated about its axis to scan a hole sensor lead portion 322 may wind up or unwind from reel 305. Alternatively, reel 305 may contain sliding electrical contacts such that the lead portion 322 may remain stationary while the sensor array portion 321 rotates.

Sensor cartridge 300 may further include a circular disc 304 between the control wheel 303 and the reel 305. Circular disc 304 may separate reel 305 and control wheel 303 such that the lead portion 322 of the sensor does not interfere with the control wheel during operation. Circular disc 320 may connected to reel 305 by a flared portion which tends to force the lead portion 322 towards the reel 305 as the lead portion is wound up on the reel.

Sensor cartridge 300 has a bearing 306 positioned between reel 305 and the expansion element 306. Bearing 306 may be a ball bearing but any suitable bearing may be used. An inner ring of bearing 306 may be fit around reel 305 or expansion element 310 at a suitable location. In some embodiment the inner ring of bearing 306 is fixed at this location while in some other embodiments the fit is loose.

Sensor cartridge 300 may have circular mount 302 located along its axis. Circular mount 302 may be configured to slide within a bearing on a scanner when sensor cartridge 300 is installed for use.

Sensor cartridge 300 has a nut 341 connected to the proximal end of shaft 340. Nut 341 is any suitable mechanism by which the scanner can allow a torque to be exerted on shaft 340. Nut may be a hexagonal nut, keyed in any suitable way, or circular. Alternatively, nut 341 can be omitted if shaft 340 can be actuated directly.

Sensor cartridge 300 may connect to a scanner for operation such as handheld scanner 210 of FIG. 2. In the embodiment shown in FIG. 3A, the scanner provides the circumferential actuator 201 that interfaces with the control wheel 303 to turn the sensor cartridge 300. The nut 341 can normally spin freely, but can be selectively constrained. This constraint prevents the rotation of nut 341, shaft 340, and the distal end of expansion element 310. In this condition, the rotation of the control wheel causes rotation of the proximal end of expansion element 310, but not the distal end of expansion element 310 resulting in the contraction (or expansion depending on the direction of the torque and handedness of the helical portion) of the radius of the helical portion.

Figure 4A:
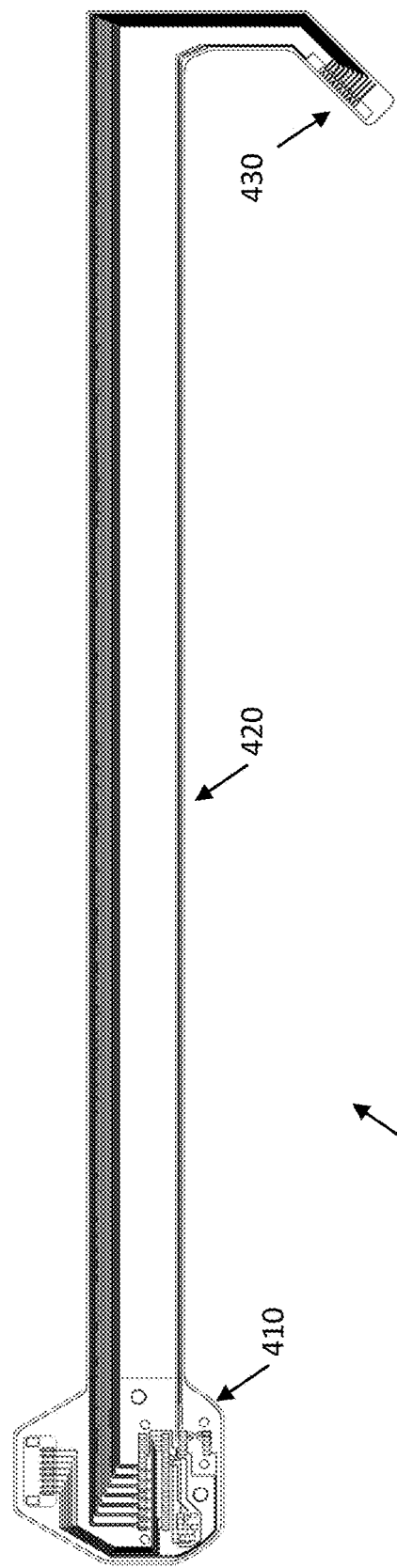
FIG. 4A is an eddy current sensor array used as part of the mandrel sensor cartridge according to some embodiments.
Figure 4B:
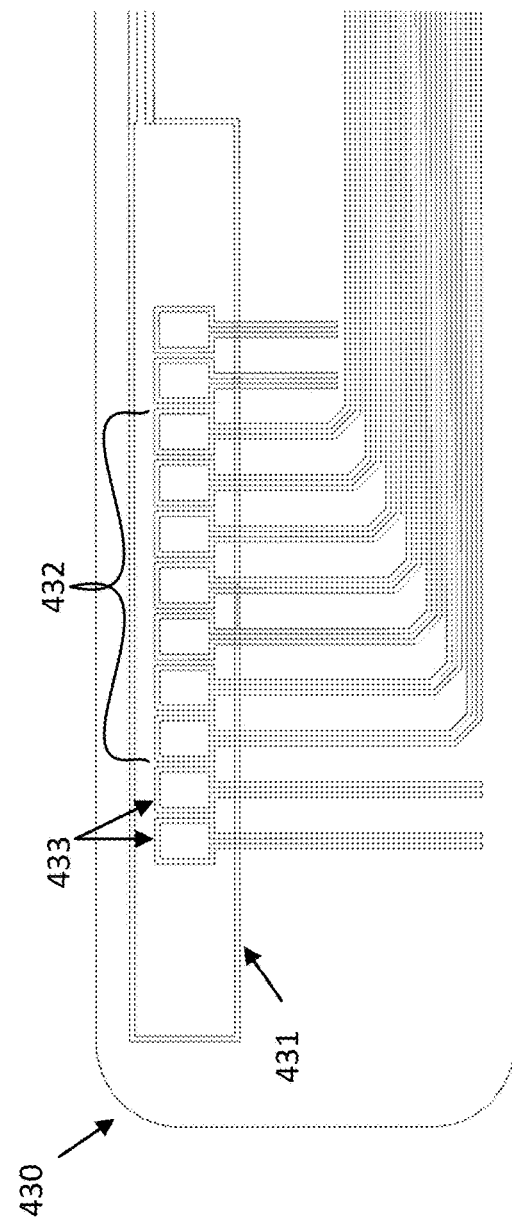
FIG. 4B is a detailed view of the eddy current array portion of the eddy current sensor array according to some embodiments.

Sensor 400 shown in FIG. 4A is an eddy current array sensor. Sensor 400 includes a connector portion 410, a lead portion 420, and an eddy current array portion 430. A detail of the eddy current array portion 430 is shown in FIG. 4B. Sensor 400 has a drive winding 431 with a linear portion, seven sensing elements 432, and dummy elements 433 flanking the sensing elements. Sensing elements 432 and the drive winding 431 have leads in lead portion 420 that connect to the connector portion 410 so that sensor 400 may be excited and measured by suitable instrumentation. It should be appreciated that the design of sensor 400 is merely and example, and that different sensor types and sensor geometries may be used in accordance with the needs of the specific application.

SECTION III—BOLT HOLE INSPECTION PROCEDURE

Figure 5A:
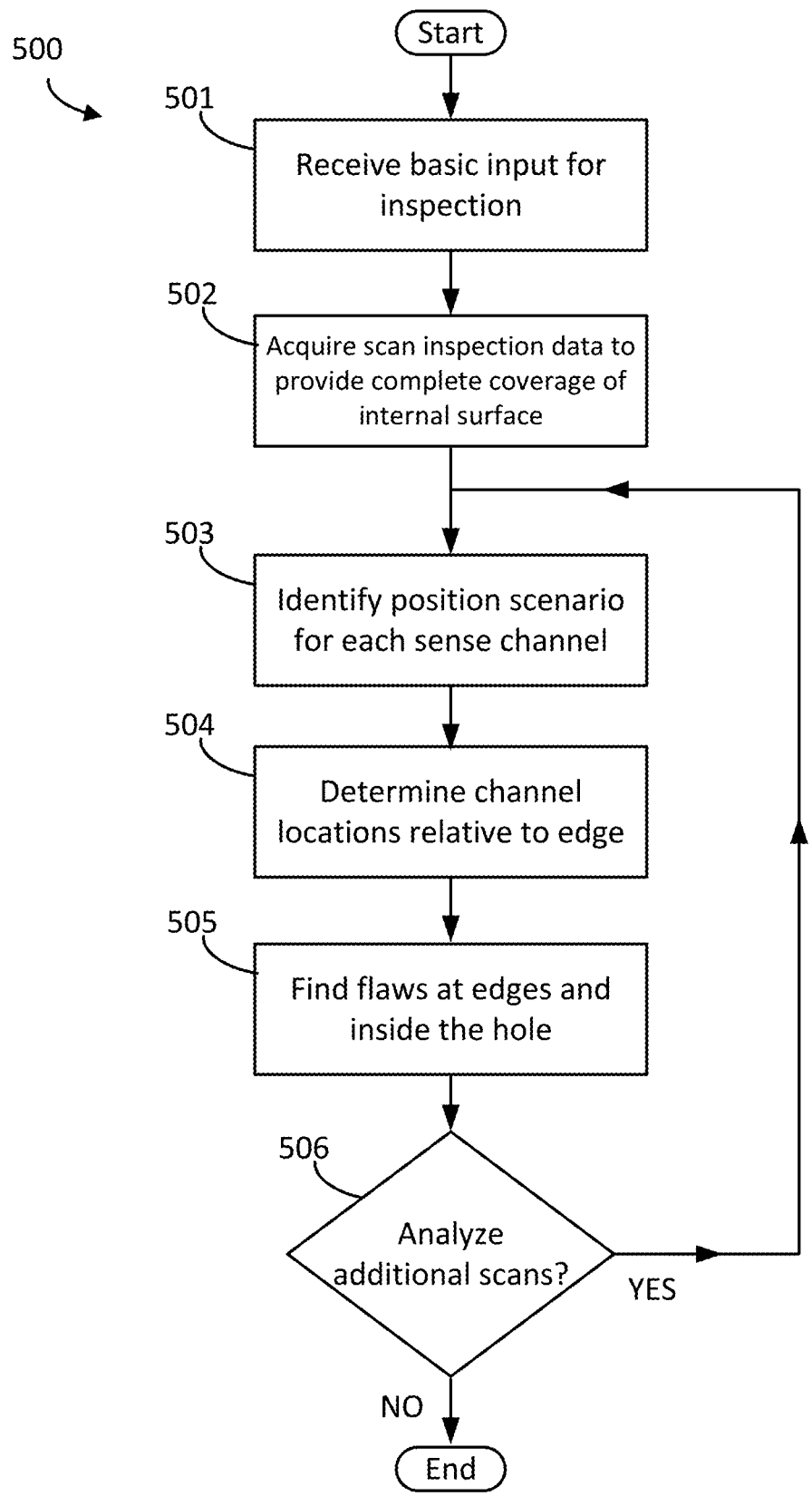
FIG. 5A is a flow diagram of a method for inspecting holes according to some embodiments.

FIG. 5A shows a flow diagram of a method 500 for inspecting holes. Method 500 may be performed using the inspection system described in connection with FIGS. 1 and 2, though method 500 may be performed in any suitable way.

At step 501 method 500 receives basic input about this inspection to be performed. This information may be provided, for example, by an inspector responsible for performing the inspection. This information may be used to support record keeping for the inspection and may incorporate location specific information about the stackup. This location specific information could help to simplify the inspection, such as the expected layer thicknesses and material layer types, but it is not required for the inspection. This information could be used to verify that the material stackup (material layer thicknesses and type) are consistent with the output of the inspection procedure.

At step 502 method 500 acquires scan inspection data within the hole. As part of step 502 the inspector may insert an inspection probe into the bolt hole and obtain one or more sets of scan data around the circumference of the hole. This could be done with a single plunge position as the circumferential position is varied, then increasing the plunge as needed and repeating the circumferential scans until the entire thickness of the hole is inspected. Note that the sense element positions relative to the edges or material layer gaps must be consistent enough and not change too rapidly to distort flaw responses compared to signature responses. What is "consistent enough" will depend upon the detection requirements for a specific inspection application. A verification check may be performed on the data to ensure that the axial position of the sense elements do not change too rapidly relative to the edge since this could distort any potential flaw responses.

At step 503 method 500 assesses the measurement data to identify a variety of features in the material stackup. For example, one feature could be the material type for each layer, such as identifying each layer as an aluminum alloy or a titanium alloy, and this could be determined by the nominal conductivity of the material within a layer. Another example is the thickness of each layer, which could be assessed through the axial variation of the conductivity. Another example is to determine the sense element position relative to the edges of the material layer as this could affect the signature responses selected for the shape filtering approach. FIGS. 5B and 5C show schematic diagrams of several potential hole inspection scenarios for aluminum and titanium material layers and the expected response to be associated with each sense element for an exemplary seven-channel eddy current sensor array. The seven sensing channels are numbered 1 through 7 and the sensor shown is sensor 400 from FIGS. 4A and 4B. Step 503 allows identification of which channels are only over metal without an interface, which channels are near an interface, which channels are over an edge (metal/air interface) or an internal interface (e.g., metal/metal interface potentially with a gap between the metal layers), and which channels are completely off of the metal (e.g., only in air).

At step 504 method 500 estimates the sense element locations relative to the edge. This provides a more quantitative estimate of the location compared to Step 503, which was binary and simply indicated either on or off of an interface. The lift-off and the responses from multiple sense elements can be used to provide this estimate of the location. This allows the appropriate signature responses to be selected from a signature library and could allow for corrections of property estimates (such as the electrical conductivity) for channels that are near but not yet over a material interface. This may be a local correction since there are usually circumferential variations in the sense element response due to the mechanical misalignment of the sensor array with the hole axis. Step 504 may also include a verification check to ensure that the circumferential variation of the channel responses are within appropriate ranges.

Note that the actual estimation of the sense element location relative to material edges may not be needed if enough characteristic flaw response shapes are included in the library of signature responses to capture the sensor flaw response variation with proximity to a material edge.

Figure 6:
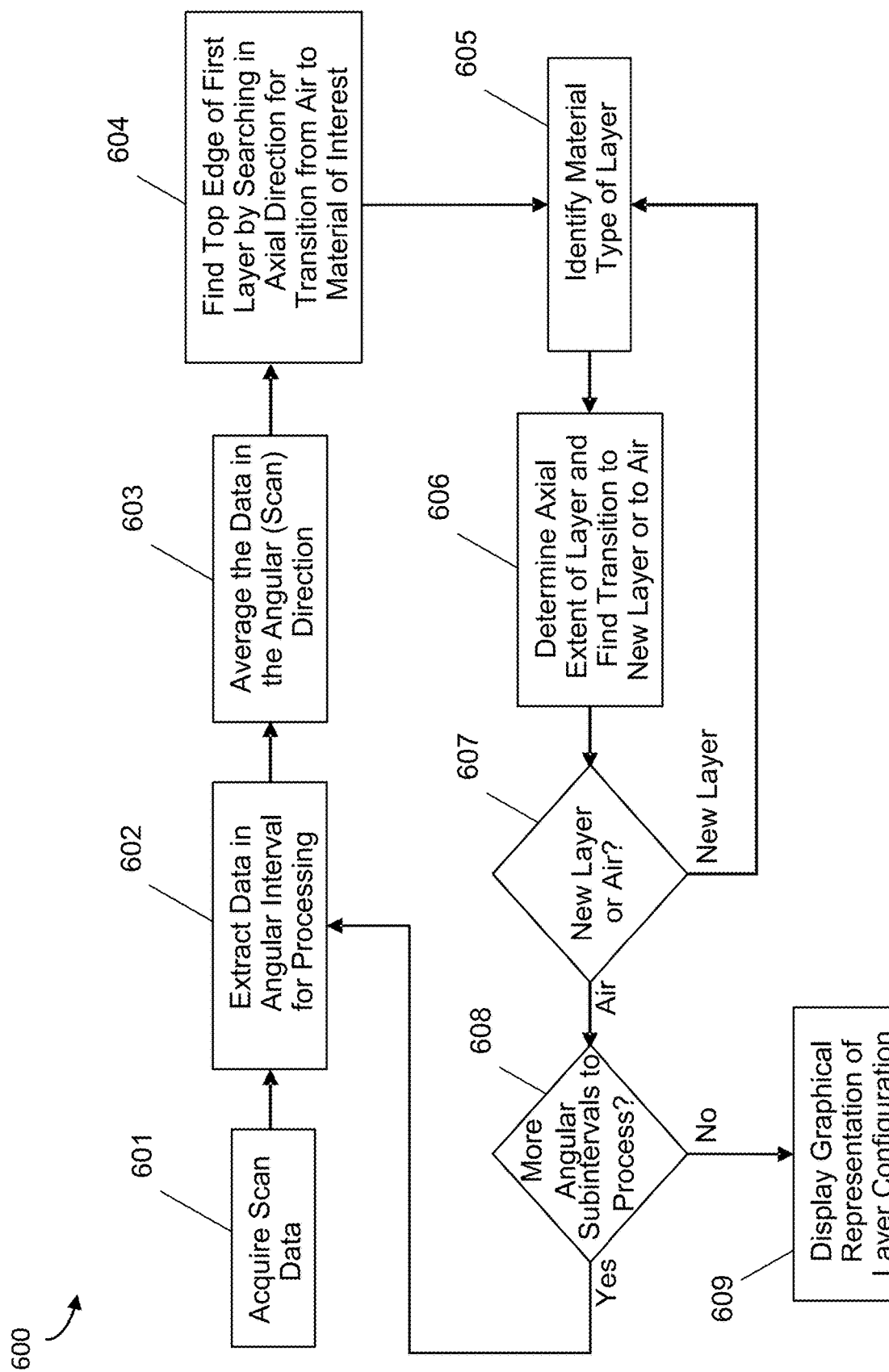
FIG. 6 is a flow diagram for a method of identifying material layers according to some embodiments.

Method 600 discussed in connection with FIG. 6 provides examples of how aspects of steps 503 and 504 may be implemented according to some embodiments.

At step 505, method 500 performs data analysis to identify any defects within the body of the hole including at edges and at internal material interfaces. Cracks are an example defect, though any suitable type of defect may be targeted for detection. In some embodiments a shape filter algorithm is used to locate responses within the scan data that are similar to characteristic shape responses from a stored library of responses. This can be used to highlight and reveal the defect response within noisy inspection data. Shape filtering may be implemented, for example, in ways discussed in Goldfine II, though any suitable shape filtering methodology may be used.

The sensor responses to a geometric feature may vary with the circumferential position of the MWM-Array relative to the geometric feature. As a result, the shape filtering algorithm may use signature responses that span a range of circumferential positions. In this way the algorithm can detect such geometric features within the scan data and also determine which signature within the library is the best match for each of the features detected and for each of the channels within the array. The best-match signatures may then be identified in the filtered data.

In some embodiments the identification information from the previous steps in method 500 are used to down-select the appropriate signature responses to be applied with the shape filter. This may reduce the processing time or processing requirements by only considering a subset of signatures from the signature library. Since the processing time for the shape filter algorithm may scale with the number of signatures, the processing speed can be improved when only a subset of the entire signature library is needed. Though, in some embodiments all signatures in the library may be processed.

The signature library may be initially generated prior to the inspection. Signatures in the library may cover the range of variations likely to be observed, such as the sense element position relative to the edge, defect type, defect positions relative to internal and external interfaces, and material type (e.g., titanium, aluminum, or more generally based on the properties of the material affecting the sensor response such as electrical conductivity). Note that one or more characteristic responses can be added to the library for known or verified defect conditions during an inspection by extracting the relevant portion of the inspection data and storing it in the library of responses. The output of the algorithm is then a filtered response for each sense element channel, which can be visualized as a B-scan plot for each channel or a C-scan image of a concatenated version of the channel responses for a scan set. Further discussion of generating and updating a signature library are discussed in Section V, below.

In some embodiments multiple scans are required to image the entire internal surface of the hole. These scans may be processed sequentially as the data is collected, in parallel, combined into a dataset analyzed for analysis or in any suitable way. In the embodiment of method 500 shown in FIG. 5A, it is contemplated that multiple scans may be taken and processed sequentially. At step 506, method 500 determines if additional data is to be analyzed, and if so returns to repeat steps 503, 504, and 505. These additional scans may be performed with the sensor array plunged further into the hole with some overlap with the previous scan(s) to provide complete coverage. All of the scan data could be obtained during step 502. In terms of the additional processing for all of the sets of data, this could involve aligning the starting circumferential position of each in order to create a composite scan image of the estimated properties, or filtered properties, for the inspection. This alignment may be needed since manual scanning may require individual adjustments for each scan set (e.g., axial and circumferential offset for each scan). This processing could also include an autonormalization process, which uses a region of relatively uniform property data for each channel that is unlikely to include a flaw and adjusting the values to reduce channel-to-channel variation. The output of this analysis may be a composite C-scan image of the inspection results that can be used to identify likely crack locations. It is generally also desirable for the image to highlight the material type of each material layer as well as any material layer edges, including internal material interfaces.

SECTION IV—LAYER THICKNESS AND MATERIAL IDENTIFICATION

FIG. 6 is a flow diagram of a method 600 for processing scan data. Method 600 may be used, for example, to determine the layer configuration of a bolt hole. In some embodiments method 600 is implemented as a module, such as modules 109 in FIG. 1. Though, method 600 may be implemented in any suitable way. In some embodiments, method 600 is used to process material property data collected by scanning the inner surface of a bolt hole in order to determine the material type and thickness of the different layers comprising the bolt hole geometry. Method 600 may be used to determine if there are variations of this geometry in the circumferential and axial directions. While method 600 is discussed with reference to bolt holes, it should be appreciated that it may be used for any suitable hole or application.

At step 601 material property data such as electrical conductivity and sensor liftoff is collected by scanning the inner surface of a bolt hole with a sensor consisting of an array of sense elements. For example, immittance measurements may first be collected from the sensor and then processed in a suitable way to provide material property estimates. In some embodiments a multivariate inverse method is used in combination with a database of precomputed sensor responses to estimate material properties.

The sensor may be scanned in the circumferential direction with the sensing elements distributed at least partially in the axial direction such that the different sense elements provide separate measurements in the axial direction producing two-dimensional material property images of the inner surface of the bolt hole. Several overlapping scans, shifted in the axial direction relative to each other, may be necessary to cover the entire inner surface of the bolt hole. The scans may be performed such that for the first scan one or more sense elements will be above the top of the hole and in air and for the last scan one or more sense elements will be below the bottom of the hole and in air.

Method 600 processes the data in successive (possibly overlapping) angular intervals. The size of these intervals may be an adjustable parameter of the module in which method 600 is implemented. Such a parameter may be set in accordance with the expected level of variation of the layer configuration around the circumference of the bolt hole inner surface.

At step 602 data in a first angular interval is extracted for processing. (As method 600 repeats, the angular interval is incremented accordingly.)

At step 603 the material property data (e.g., electrical conductivity) within the angular interval is averaged separately for each sense element and each axially incremented scan. If for example, the sensor array had seven sensing elements and five different axial positions were scanned, step 603 would produce 35 averages for each material property.

At step 604 the averaged data is searched in the axial direction looking for a transition from material properties consistent with a sense element in air to those of a material layer. This identifies the top edge of the first layer of the bolt hole geometry in this angular interval.

At step 605 the algorithm uses the estimated material properties to identify the material type of the layer. In some embodiments, a set of material types with material properties distinguishable using the sensor measurements is known such that the layer can be identified as a material type in the set. Consider for example, if only an aluminum alloy and a titanium alloy are expected to form the layers of the bolt hole. Method 600 may be able to identify a layer as the aluminum alloy or the titanium alloy based on the nominal electrical conductivity of the material layer.

At step 606 the axial extent (thickness) of the layer is determined and the bottom edge of the layer is located. If adjacent layers are different materials with sufficiently distinct material properties then the method used in this step can consist of searching for such a transition of the material properties. In cases where adjacent layers may be composed of the same or similar materials then the method for locating the bottom edge of the current layer is to use the shape of the variation of the effective material properties in the axial direction. For example, the edge effects on the effective material properties can result in a local maximum or minimum of one of the material properties at the axial midpoint of the layer.

At step 607, method 600 branches depending on whether or not the bottom edge of the layer located at step 606 marked a transition to air indicating that the bottom of the hole has been found. In the case of a transition to air, method 600 advances to step 608. Otherwise there is a new layer to analyze and the algorithm loops back to step 605.

At Step 608, method 600 has completed the analysis of the current angular interval and branches depending on whether or not there are additional angular intervals to process. If there are unprocessed angular intervals method 600 returns to step 602 to begin processing the next angular interval. In some embodiments, some or all angular intervals are processed in parallel to expedite method 600.

If there are not unprocessed angular intervals analysis of the layer configuration is complete and method 600 advances to step 609.

At Step 609, method 600 displays a graphical representation of the layer configuration of the inner surface of the bolt hole. This may consist of a two-dimensional image of the inner surface showing different material types in different colors and with layer boundaries delineated. In some embodiments, step 609 is part of an automated reporting process which may also include reporting the the location of primary and secondary features as discussed in Section V.

Estimation of layer thickness is one innovation that is improved by using an eddy current sensor with a linear drive and two or more sensing elements, where the data for each sensing element is recorded simultaneously. Though, method 600 may be used in combination with any suitable sensor type or configuration.

SECTION V—SHAPE FILTERING

As discussed earlier in Section III, shape filtering may be applied to improve detectability of defects in holes or other test objects more generally. A shape filter module is described that may be used to enhance sensitivity to a primary feature and/or to reduce the response to a secondary feature. In this context a "primary feature" is a feature that is the target of the inspection. A primary feature may be a material defect such as a crack, a material gap indicative of corrosion, or any other feature which an inspection is designed to detect. A "secondary feature" may be described as benign feature that has a characteristic sensor response. For a bolt hole inspection a secondary feature may be, for example, a scratch, the presence of debris between layers, response to a layer edge, dings at a corner, a burr or other debris from cleaning the hole, out of roundness effects or other surface or geometric features. For corrosion imaging in a joint a secondary feature could be, for example, a fastener response, the response of a groove between materials in a layer, or a response of a material edge. Reducing the response of a secondary feature, that is inconsequential, may allow a primary feature to be more readily detected or accurately sized. A shape filter module may, for example, be implemented in any of the ways described in connection with modules 109 (FIG. 1).

For both primary and secondary features, a goal of the shape filter is to locate responses within the scan data that are similar to characteristic shape responses from a stored library of responses. This stored library of responses can be described as a signature library. The signature library can be used to reveal and enhance the primary (e.g., flaw) response within inspection data that includes noise or other error sources or responses from secondary features. The sensor responses to a geometric feature vary with the properties of the feature. For example, in the case of a crack the sensor response may vary with crack length and depth (and similarly for an EDM notch which may be used to simulate a crack). Similarly, in the case of a secondary feature, the sensor response varies with material type and dimensions of the secondary feature (e.g., the sensor response varies with the diameter of a fastener head for corrosion imaging, or the thickness of a layer or a scratch for a bolt hole inspection). The sensor responses can also vary with the sensor position relative to the feature. As a result, the shape filter module may use signature responses that span a range of properties that capture the variability of the feature response so that its response can be enhanced for detection or reduced for anomaly suppression, as appropriate. In some embodiments, a material property or dimension may be estimated and used to select the appropriate signature from the library. This property or dimension might be, for example, the conductivity of a layer, the distance from an edge, the thickness of a layer, or the position of the defect response between adjacent channels in a sensor array. A convenient method for applying this filter is to determine which signature within the library is the best match for each of the features of interest and for each of the channels within the sensor array. The best-match signature is then used to highlight the feature in the filtered data for feature enhancement or used to remove the feature response for secondary feature (anomaly) suppression.

Figure 7:
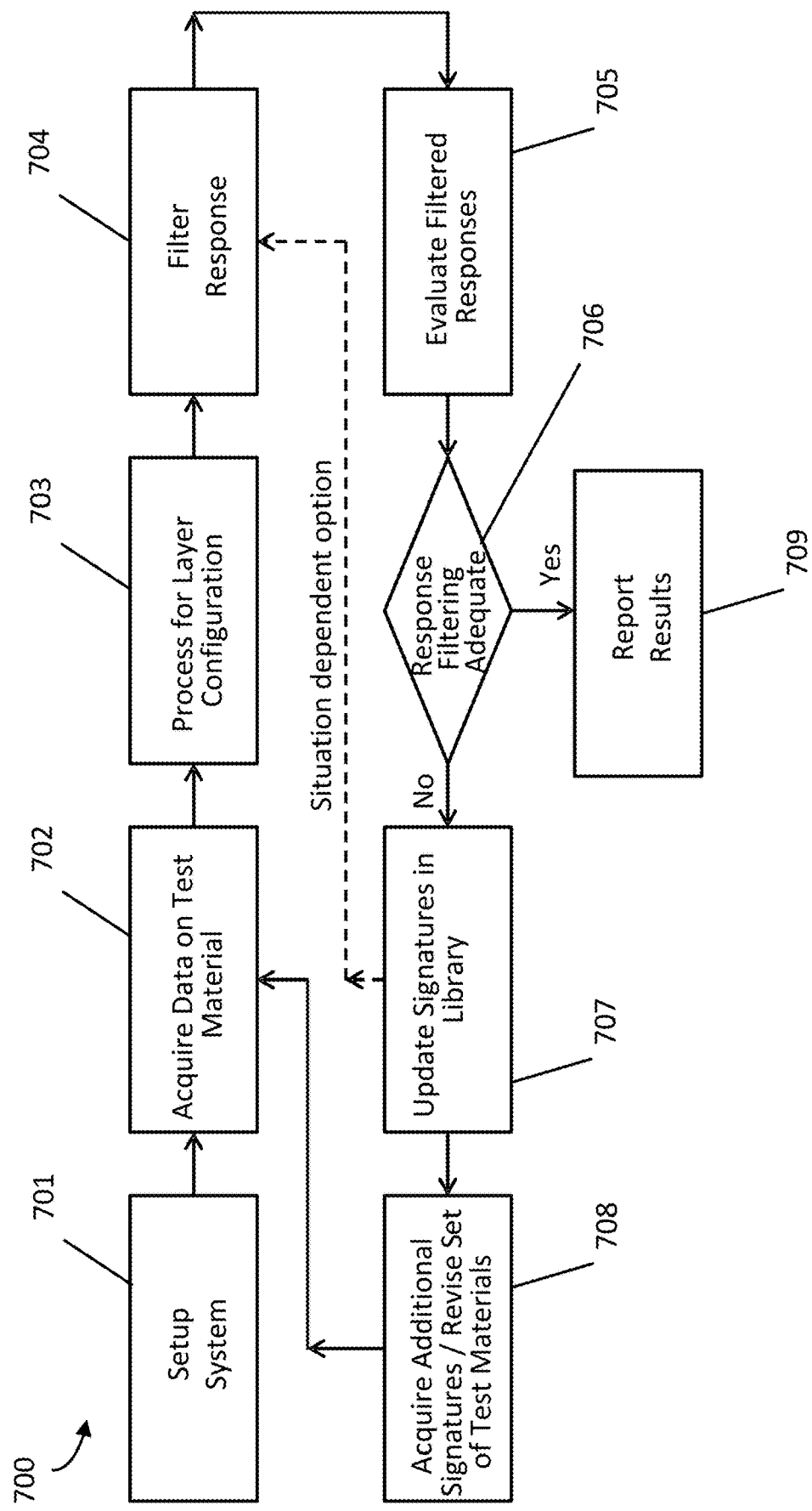
FIG. 7 is a flow diagram for a method of generating a library of signature responses according to some embodiments.

FIG. 7 provides a method 700 for building a signature library according to some embodiments. A goal of method 700 is to have a small number of signatures which enables faster processing for the filtering algorithm while still detecting and performing appropriate analysis on all features of interest. The steps of method 700 are detailed and example applications are discussed. Method 700 may be used for building a signature library for primary features (e.g., for feature detection, such as crack detection in bolt holes) and secondary features (e.g., for anomaly suppression, such as the removal of fastener responses to improve detection and characterization capabilities for corrosion material loss).

At step 701 method 700 sets up the inspection system. This involves assembling the components for the system, performing the calibration or standardization to obtain repeatable and reproducible values for known material conditions, and verifying the performance of the system. The inspection system may be an embodiment of system 100 (FIG. 1), though any suitable inspection system may be used. This performance verification can be performed as electrical conductivity or magnetic permeability measurements on reference materials with known properties or on unflawed materials with known nominal properties. Typically this verification confirms that the property value measured with the system is comparable to the value expected for the material. The performance verification may also include variations in the liftoff. Note that the liftoff test is aimed at confirming that the measured property value is essentially independent from the liftoff over the liftoff range of interest for the inspection. Step 701 may also include loading, or providing access to, a previously obtained library of signature responses.

At step 702, method 700 acquires data from a test object. This step may include a verification that the scanned area fully covers the region of interest for the inspection and an initial identification of observable features in the measured scan responses. This could also include the determination of categorization of these features as relevant, such as a crack or material loss, or anomalous (or non-relevant), such as a boundary between two material layers or a fastener, but this is only an initial determination. In some embodiments, step 702 involves inserting a probe (e.g., sensor cartridge 300, FIG. 3A) into a bolt hole and obtaining one or more sets of scan data around the circumference of the hole. This could be done with a single plunge position as the circumferential position is varied, then increasing the axial plunge as needed and repeating the circumferential scans until the entire thickness of the bolt hole is inspected. As another example, step 702 may involve one or more scans over the skin surface of material having subsurface structural elements, such as a lap joint. After the scan over the structural elements, the fastener pattern and possibly the layout of the subsurface structural elements should be visible. Generally the fastener responses would be considered anomalous compared to the material loss from corrosion that could be in the vicinity of the fasteners.

Step 703 refers to the application of a processing algorithm to determine the layer configuration. This is done to identify different material types and layer thicknesses within the test material. This could be used to verify the inspection as well, if apriori knowledge of the material stack up for the region of interest is available. For example, for bolt hole inspection a single excitation frequency could be used with the measured responses at different axial positions within the bolt hole to determine the material type and thickness of each of the different layers comprising the test material geometry. Similarly, for a lap joint, one or more frequency measurements could be used to identify the material type and thickness of the layers perpendicular to the inspection surface. In particular, high frequency measurements, where the penetration depth is comparable to or smaller than the thickness of the near surface skin layer of the test material, can be used to identify the type of material, such as an aluminum alloy, for the skin, to determine the presence of the near surface defects such as pits, and to determine regions of nonconductive coating variations, such as paint, that may be of interest. In one such embodiment the thickness of the paint (estimated from the liftoff) or an estimated layer thickness may be used to select the appropriate signatures for defect detection or secondary feature suppression. Similarly, low frequency measurements, where the penetration depth is comparably larger than the thickness of the near surface skin layer of the test material, can be used in combination with the high frequency measurements to determine the thickness of the skin layer and to identify the type of material for the subsurface layers, such as an aluminum alloy or a magnetic steel. This step could also be used to determine the presence of the subsurface defects such a corrosion material loss but it is preferable to perform this evaluation after the anomalous responses have been removed, for the example of corrosion imaging. Method 600 discussed above in connection with FIG. 9 provides an example embodiment of how step 703 may be implemented.

At step 704 method 700 determines the filter response for the inspection data for a library of signature responses. Subsets of the signature library responses could be used. For example, signature responses appropriate for cracks in titanium alloys or aluminum alloys could be used along with the layer type identification of step 703 to reduce the number of signatures used as part of the shape filtering approach since the signatures for the incorrect material type may not be inappropriate. In other words (and for example), using crack signatures for a titanium alloy may not be appropriate for an aluminum alloy. For the bolt hole inspection, the filtering process is aimed at improving the response to the defect features. However, for the material loss inspection, the filtering process is aimed at the removal of anomalous responses not associated with the material loss such as the responses from fasteners or material edges. In this case, different signature responses may be required based upon the material type of the subsurface layers, such as a magnetic steel alloy versus an aluminum alloy. Note in one embodiment the signatures may be extracted and placed in the signature library from neighboring fasteners. In one such embodiment, after the detection process is first completed, if the fasteners that are observed by the operator have not been completely removed (suppressed) from the response images, then the operator may extract a response from a apparently similar fastener (based on his visual observations or on the sensor responses) in the neighborhood of the joint area of interest. This would enable improved fastener suppression (or suppression of other such secondary features) by using similar features in the neighborhood or even within the inspection area of interest. In another embodiment, instead of the immediate neighborhood, a signature might be extracted and added to the library for secondary feature suppression, from a similar area on the same aircraft or even from a different aircraft with similar or the same fastener types and joint configurations.

At step 705 method 700 evaluates the filtered responses with a goal of determining the adequacy of the filtering process in Step 704. This evaluation can take a variety of different forms. For defect detection, such as crack detection or material loss detection, this could be a comparison to known defect feature conditions. The comparison could be a hit/miss type of analysis to determine if known defects are missed or a comparison of measured response levels to determine if the response level correlates with the properties of the defect condition, such as crack length, crack depth, or material loss depth. For anomaly suppression, the evaluation of the filtered response in the vicinity of each anomaly can be assessed through the variation of the impedance response and/or a measured property response (such as material layer conductivity or thickness). This evaluation could simply determine if the response variation is within a threshold level of the baseline value. For example, the electrical conductivity typically varies by several % IACS in the vicinity of typical fasteners within joined aluminum alloy panels having a nominal electrical conductivity of 32% IACS. The threshold could be that the electrical conductivity difference between the fastener response and the panel response must be less than 0.5% IACS. If the anomaly response exceeds the threshold then this response can be a candidate for a signature to be added to the library of signature responses.

Step 706 provides a decision opportunity based upon the adequacy of the filtering process. As with Step 705, this decision can take a variety of different forms. For defect detection such as a bolt hole inspection, this could include an assessment of the probability of detection, the false call rate, and generation of a receiver operator curve (i.e., POD vs False call rate), or another form of reliability and repeatability statistical analysis to independently assess feature detection and suppression performance. For anomaly suppression, this assessment is primarily aimed at determining if the features of interest, such as material loss from corrosion or a crack in a bolt hole, can be detected even if the anomalies are not fully or completely suppressed. For example, if a gap between the joint skin layers leads to an anomaly response that is not suppressed, this may not affect the detectability of the material loss if the areal extent of the material loss of interest is much larger than a dimension of the gap response. However, if any of the known anomaly responses, such as fastener responses, exceed a threshold response, then the anomaly suppression may not be adequate. If the performance level is satisfactory, then the procedure can proceed to Step 709 and the results of the measurement or the inspection can be reported. In either case, if the performance level is not satisfactory, then the signature library should be updated as in Step 707.

Step 707 refers to actions performed to update the signature library and to improve performance for the measurement or inspection. In either case, for defect detection or anomaly suppression, it may be desirable to remove signature responses from the library in order to reduce processing time with the shape filter. The signatures to be removed may be inappropriate for the inspection, such as the fastener type or size may not be relevant to a particular inspection or the signatures may be similar to other signatures in the library, or the signatures may correspond to feature dimensions that are not of interest, such as 0.010 in. long cracks when only cracks that are longer than or equal to 0.020 in. are of interest. Also for both defect detection and anomaly suppression, the response from a feature of interest can be captured and added to the library of signature responses. This could be from data that was acquired as part of Step 702 and could be for a crack that was missed as part of the inspection or for a fastener that had a response which was not suppressed. In the case of bolt hole inspection, signatures might be acquired from representative samples with representative features that must be not only suppressed but also identified. Features in bolt holes such as scratches, debris, shallow pits, burrs, or other surface and geometric anomalies might need to be both suppressed and identified. In some cases the identification of an anomaly such as a burr or debris, might result in adjustment of the primary feature detection threshold to avoid a false call. In another such embodiment the signature of the inconsequential anomaly (e.g. a burr) might be used to suppress the associated response, without removing the response of a primary feature that might occur in the vicinity. In one embodiment, the identification of the inconsequential feature, may prompt the operator to view the responses and make a judgment on whether the response is due to an inconsequential feature or a primary feature that must be detected, or to simply determine that the hole is uninspectable or needs to be cleaned further before proper inspection. The process of building the signature library can be repeated for additional features. Once the signature library is updated the next step depends upon the situation. For anomaly suppression the data has already been acquired and the next step would be to proceed to Step 704. If desired, Step 702 could be repeated as well but it is not necessary. For defect detection, the next step is Step 708.

Step 708 refers to the acquisition of additional signature responses and updating the set of materials in the test set. This primarily applies to the generation of the signature library for defect detection since the evaluation of the signature library through a performance study such as a probability of detection study should not incorporate measurements that were used for both creating the signature library and for assessing the system performance. This may require obtaining additional measurements on similar samples, possibly on electrical discharge machined (EDM) notches instead of real cracks and possibly on similar alloy materials. For each feature and variation of interest, such as several scans where the axial position is changed so that the feature position relevant to the sense element in an array is varied, the signature response is added to the library. The filtered response (Step 704) is repeated to verify that the desired feature response is enhanced by the updated library. Any of the material samples used to generate signatures that were placed into the library of signature responses is considered part of a training set and is not part of the evaluation set. However, in cases where sufficient sample sets are not available, a subject matter expert may choose to keep the sample used to generate the signature library within the set and retake the data to make it as independent as practical. Consequently, this set of test materials, or the evaluation, may be updated and the data acquisition step (Step 702) should be repeated.

This process allows the signature library to be generated or updated as needed depending upon the inspection application. An initial signature library is not required for this process. Note that a signature library might be generated in advance, or during an inspection or both. The decision to modify a signature library must be made in the context of historical, present and future performance. Note that if the data from the inspection method is digital and archivable, then a smaller signature library might be used during the performance of inspections to provide an initial result to the operator, and later a larger signature library might be used to process the data again. Careful records of the signature library contents used for each inspection and later analysis is needed to properly compare results and support decisions regarding fitness for service. Comparisons within a single part, for multiple parts or across fleets must ensure that the same signature libraries are used and the same inspection settings. This should be verified if practical on a standard. Having data on a standard, even if it is not used for calibration, is helpful to verify consistency across inspections.

It should be appreciated that while anomaly suppression was discussed above in connection with corrosion detection, it may also be used to enhance detection of defects in bolt holes. For example, if a hole is cleaned and the cleaning produces a burr at an edge, the presence of the burr might produce a response that results in a false call or makes the hole uninspectable for conventional eddy current methods. One solution is to extract signatures of typical burrs and other such features that require identification and/or suppression, including debris, scratches, dinged edges, out of roundness, pits. Identification requires use of a range of signatures in a signature library that are used to process the inspection data to find a best match to the secondary feature. In one such embodiment, if the secondary feature is identified (e.g. a burr at an edge) then a confidence level might be reported regarding its identification and the likelihood that it is a burr and not a crack. This likelihood could be derived from the quality of the match to a library of burr responses as well as the match to a crack response to enable differentiation between burrs and cracks. In one such embodiment the response from the secondary feature may be above a predetermined threshold that is established by locating EDM notches near known burrs in a training set of samples. In this embodiment, the threshold is determined above which the EDM notch response is statistically distinguishable from the burr (or other secondary anomaly) response. If the secondary anomaly response is above the threshold, then an action might be prompted. Such actions might include, cleaning a bolt hole to remove the burr, extracting a new signature from a more representative sample to add to the suppression or detection library, or prompting the operatore to view the responses of multiple channels to make a recommendation based on experience, or visual observations.

In the case of scratch detection and location within a bolt hole, the liftoff signatures from representative scratches may be used to identify a scratch and estimate depth of the scratch. If the scratch is shallow, the software may allow the inspection for cracks to proceed. If the scratch is deeper than a predetermined depth the inspection for cracks may be halted or a measure of hole quality may require a maintenance action on the hole to improve the quality.

In one embodiment of this invention there are multiple primary (damage or quality) features that may require enhancement using a signature library and multiple secondary features (inconsequential features that only obscure the primary features). In one such embodiment, a subset of primary and secondary features are processed using associated signature libraries to enhance the primary responses and suppress the secondary responses. In one such embodiment, for features that are not processed (often called filtered) with a signature library, a multivariate inverse method is used to estimate a property where the spatial or temporal response of the property is perturbed by the presence of the feature of interest and is apparent beyond a detection threshold without the need for a signature library. In one such example, the feature is the location of an edge of a layer in a bolt hole for a secondary feature, or debris between layers or a burr resulting from cleaning of the hole. In another such example the primary feature is the thinning of a metal layer in a joint caused by corrosion that must be distinguished from a fastener response.

SECTION VI—CLOSING DISCUSSION

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Accordingly, the foregoing description and drawings are by way of example only.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smartphone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the invention may be embodied as a computer readable medium (or multiple computer readable media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

In this respect, it should be appreciated that one implementation of the above-described embodiments comprises at least one computer-readable medium encoded with a computer program (e.g., a plurality of instructions), which, when executed on a processor, performs some or all of the above-discussed functions of these embodiments. As used herein, the term "computer-readable medium" encompasses only a computer-readable medium that can be considered to be a machine or a manufacture (i.e., article of manufacture). A computer-readable medium may be, for example, a tangible medium on which computer-readable information may be encoded or stored, a storage medium on which computer-readable information may be encoded or stored, and/or a non-transitory medium on which computer-readable information may be encoded or stored. Other non-exhaustive examples of computer-readable media include a computer memory (e.g., a ROM, a RAM, a flash memory, or other type of computer memory), a magnetic disc or tape, an optical disc, and/or other types of computer-readable media that can be considered to be a machine or a manufacture.

The terms "program" or "software" are used herein in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

For the purposes of describing and defining the present disclosure, it is noted that terms of degree (e.g., "substantially," "slightly," "about," "comparable," etc.) may be utilized herein to represent the inherent degree of uncertainty that may be attributed to any quantitative comparison, value, measurement, or other representation. Such terms of degree may also be utilized herein to represent the degree by which a quantitative representation may vary from a stated reference (e.g., about 10% or less) without resulting in a change in the basic function of the subject matter at issue. Unless otherwise stated herein, any numerical values appeared in this specification are deemed modified by a term of degree thereby reflecting their intrinsic uncertainty. The "substantially simultaneous response" means responses measured within 1 second of one another.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. An apparatus comprising:
a sensor cartridge having
a control wheel;
a shaft having an axis that is co-axial with the control wheel;
an expansion element co-axial with the shaft, having a helical portion, a first location and a distal end, wherein the expansion element is operably fixed to the control wheel at a first location and operably fixed to a distal end of the shaft at the distal end of the expansion element; and
a sensor having a sensing array portion, the sensing array portion attached to the helical portion of the expansion element.

2. The apparatus of claim 1, wherein the control wheel is toothed around its circumference.

3. The apparatus of claim 1, wherein the sensor cartridge further comprises a nut operably fixed to a proximal end of the shaft.

4. The apparatus of claim 1, wherein
the sensor further comprises a lead portion, and
the sensor cartridge further comprises a reel co-axial to the shaft for winding the lead portion of the sensor.

5. The apparatus of claim 4, wherein the reel is positioned along the axis between the control wheel and the helical portion of the expansion element.

6. The apparatus of claim 5, wherein the sensor cartridge further comprises a bearing having an inner ring, wherein the inner ring is around the reel.

7. The apparatus of claim 5, wherein the sensor cartridge further comprises a circular disc co-axial with the shaft and having a hole therein through which the shaft passes, the circular disc operably fixed to the control wheel on one side, and operably fixed to the reel on an opposite side.

8. The apparatus of claim 7, wherein the expansion element, reel, and circular disc are a single piece of material.

9. The apparatus of claim 8, wherein the expansion element, reel and circular disc are fabricated by an additive manufacturing process.

10. The apparatus of claim 1, wherein the helical portion comprises a first helix and a second helix, and the sensing array portion is attached to the first helix of the helical portion.

11. The apparatus of claim 10, wherein a first width of the first helix is greater than a second width of the second helix, the first and second widths being measured in an axial direction defined by the shaft.

12. The apparatus of claim 11, wherein the first helix comprises an inset into which a sensor array portion of the sensor is attached.

13. A sensor cartridge comprising:
a control wheel;
a shaft having an axis that is co-axial with the control wheel;
an expansion element co-axial with the shaft, having a helical portion, a first location and a distal end, wherein the expansion element is operably fixed to the control wheel at a first location and operably fixed to a distal end of the shaft at the distal end of the expansion element; and
a sensor having a sensing array portion, the sensing array portion attached to the helical portion of the expansion element.

14. The sensor cartridge of claim 13, wherein the sensor further comprises a lead portion, and the sensor cartridge further comprises a reel co-axial to the shaft for winding the lead portion of the sensor.

15. The sensor cartridge of claim 14, wherein the reel is positioned along the axis between the control wheel and the helical portion of the expansion element.

16. The sensor cartridge of claim 15 further comprising a bearing having an inner ring, wherein the inner ring is around the reel.

17. The sensor cartridge of claim 15, further comprising a circular disc co-axial with the shaft and having a hole therein through which the shaft passes, the circular disc operably fixed to the control wheel on one side, and operably fixed to the reel on an opposite side.

18. The sensor cartridge of claim 13, wherein the helical portion comprises a first helix and a second helix, and the sensing array portion is attached to the first helix of the helical portion.

19. The sensor cartridge of claim 18, wherein a first width of the first helix is greater than a second width of the second helix, the first and second widths being measured in an axial direction defined by the shaft.

20. The sensor cartridge of claim 19, wherein the first helix comprises an inset into which a sensor array portion of the sensor is attached.

* * * * *